(12) United States Patent
Tong

(10) Patent No.: US 12,720,968 B2
(45) Date of Patent: Aug. 25, 2026

(54) DISPLAY PANEL AND DISPLAY APPARATUS

(71) Applicant: HUBEI YANGTZE INDUSTRIAL INNOVATION CENTER OF ADVANCED DISPLAY CO., LTD., Wuhan (CN)

(72) Inventor: Xiaoyang Tong, Wuhan (CN)

(73) Assignee: HUBEI YANGTZE INDUSTRIAL INNOVATION CENTER OF ADVANCED DISPLAY CO., LTD., Wuhan (CN)

(*) Notice: Subject to any disclaimer, the term of this patent is extended or adjusted under 35 U.S.C. 154(b) by 0 days.

(21) Appl. No.: 19/085,689

(22) Filed: Mar. 20, 2025

(65) Prior Publication Data

US 2025/0221179 A1 Jul. 3, 2025

(30) Foreign Application Priority Data

Sep. 27, 2024 (CN) ......................... 202411365603.1

(51) Int. Cl.
*H10K 59/122* (2023.01)
*G09G 3/32* (2016.01)
*H10K 59/80* (2023.01)

(52) U.S. Cl.
CPC ............. *H10K 59/122* (2023.02); *G09G 3/32* (2013.01); *H10K 59/879* (2023.02); (Continued)

(58) Field of Classification Search
CPC ............... H10K 59/122; H10K 59/879; H10K 59/8792; H10K 59/121; H10K 59/126; (Continued)

(56) References Cited

U.S. PATENT DOCUMENTS 11,329,258 B2 * 5/2022 Gong .................. H10K 59/124
11,943,962 B2 * 3/2024 Xiao .................... H10K 59/879
(Continued)

FOREIGN PATENT DOCUMENTS

CN 116940185 A 10/2023
CN 117690378 A 3/2024

*Primary Examiner* — Benyam Ketema
(74) *Attorney, Agent, or Firm* — Tarolli, Sundheim, Covell & Tummino LLP

(57) ABSTRACT

A display panel includes a substrate, a display layer, a light-blocking structure, and light-guiding structures. The display layer includes a pixel definition layer and light-emitting devices. The pixel definition layer includes a first opening and a second opening. The light-emitting devices include a first light-emitting device and a second light-emitting device. An orthographic projection of at least part of the light-blocking structure on the substrate is located between orthographic projections of two adjacent light-emitting devices on the substrate. Along a first direction parallel to a plane of the substrate, a distance between the light-blocking structure and the first opening is smaller than a distance between the light-blocking structure and the second opening. Along a direction perpendicular to the plane of the substrate, the first light-emitting device at least partially overlaps the light-guiding structures, and/or the second light-emitting device at least partially overlaps the light-guiding structures.

32 Claims, 9 Drawing Sheets

(52) U.S. Cl.
CPC . *H10K 59/8792* (2023.02); *G09G 2300/0452* (2013.01); *G09G 2300/0842* (2013.01); *G09G 2300/0861* (2013.01); *G09G 2310/08* (2013.01); *G09G 2320/0233* (2013.01); *G09G 2320/028* (2013.01); *G09G 2330/021* (2013.01); *G09G 2358/00* (2013.01)

(58) Field of Classification Search
CPC .. H10K 59/35; G09G 3/32; G09G 2300/0452; G09G 2300/0842; G09G 2300/0861; G09G 2310/08; G09G 2320/0233; G09G 2320/028; G09G 2330/021; G09G 2358/00; G09F 9/30
See application file for complete search history.

(56) References Cited

U.S. PATENT DOCUMENTS

| | | | | |
|---|---|---|---|---|
| 12,010,898 | B2 * | 6/2024 | Tsai | H10K 59/879 |
| 2020/0293739 | A1 * | 9/2020 | Yang | H10K 59/131 |
| 2021/0375969 | A1 * | 12/2021 | Wu | G06V 10/143 |
| 2022/0277691 | A1 * | 9/2022 | Wang | H10K 59/131 |
| 2023/0006181 | A1 * | 1/2023 | Wu | G06V 40/1318 |
| 2023/0082085 | A1 * | 3/2023 | Xiao | H10K 59/8792 257/91 |
| 2023/0113976 | A1 * | 4/2023 | Kim | H10K 50/854 257/618 |
| 2023/0215357 | A1 * | 7/2023 | Hong | H10K 59/879 345/174 |
| 2023/0217690 | A1 * | 7/2023 | Hong | H10K 59/353 345/173 |
| 2023/0232669 | A1 * | 7/2023 | Kim | H10K 59/60 136/259 |
| 2023/0247865 | A1 * | 8/2023 | Cui | H10K 59/126 257/40 |
| 2023/0296224 | A1 * | 9/2023 | Tsai | H10K 59/879 362/84 |
| 2023/0317695 | A1 * | 10/2023 | Liu | H10H 29/142 |
| 2024/0032402 | A1 * | 1/2024 | Shi | H10K 59/879 |
| 2024/0040828 | A1 * | 2/2024 | Dong | H10K 59/8792 |
| 2024/0127760 | A1 * | 4/2024 | Cho | B60K 35/60 |
| 2024/0292721 | A1 * | 8/2024 | Tsai | G02F 1/13 |
| 2025/0140176 | A1 * | 5/2025 | Lee | G09G 3/32 |
| 2025/0209965 | A1 * | 6/2025 | Gong | G09G 3/30 |

* cited by examiner

DISPLAY PANEL AND DISPLAY APPARATUS

CROSS-REFERENCE TO RELATED APPLICATION

The present application claims priority to Chinese Patent Application No. 202411365603.1, filed on Sep. 27, 2024, the content of which is incorporated herein by reference in its entirety.

TECHNICAL FIELD

The present disclosure relates to the field of display technology and, in particular, to a display panel and a display apparatus.

BACKGROUND

Users have privacy needs when using display products in public places. Although anti-peeping film meets the privacy needs of users, only the user facing the screen can clearly see the content on the screen after applying the anti-peeping film, which limits the use environment of the display product with the film. Therefore, the research on active anti-peeping solution is one of the technical problems that need to be solved for current display products. However, the current active anti-peeping solution will lead to an increase in power consumption of the display panel.

SUMMARY

A first aspect of the present disclosure provides a display panel. The display panel includes a substrate, a display layer located on a side of the substrate, a light-blocking structure located on a side of the display layer away from the substrate, and light-guiding structures located on the side of the display layer away from the substrate. The display layer includes a pixel definition layer and light-emitting devices. The pixel definition layer includes a first opening and a second opening. One of the light-emitting devices includes a first light-emitting device and a second light-emitting device. The first light-emitting device is located in the first opening, and the second light-emitting device is located in the second opening. An orthographic projection of at least part of the light-blocking structure on the substrate is located between orthographic projections of two adjacent light-emitting devices on the substrate. Along a first direction, a distance between the light-blocking structure and the first opening is smaller than a distance between the light-blocking structure and the second opening, and the first direction is parallel to a plane of the substrate. Along a direction perpendicular to the plane of the substrate, the first light-emitting device at least partially overlaps the light-guiding structures, and/or the second light-emitting device at least partially overlaps the light-guiding structures.

Another aspect of the present disclosure provides a display apparatus. The display apparatus includes a display panel. The display panel includes a substrate, a display layer located on a side of the substrate, a light-blocking structure located on a side of the display layer away from the substrate, and light-guiding structures located on the side of the display layer away from the substrate. The display layer includes a pixel definition layer and light-emitting devices. The pixel definition layer includes a first opening and a second opening. The light-emitting devices include a first light-emitting device and a second light-emitting device. The first light-emitting device is located in the first opening, and the second light-emitting device is located in the second opening. An orthographic projection of at least part of the light-blocking structure on the substrate is located between orthographic projections of two adjacent light-emitting devices on the substrate. Along a first direction, a distance between the light-blocking structure and the first opening is smaller than a distance between the light-blocking structure and the second opening, and the first direction is parallel to a plane of the substrate. Along a direction perpendicular to the plane of the substrate, the first light-emitting device at least partially overlaps the light-guiding structures, and/or the second light-emitting device at least partially overlaps the light-guiding structures.

BRIEF DESCRIPTION OF DRAWINGS

In order to more clearly explain the embodiments of the present disclosure or the technical solution in the related art, the drawings to be used in the description of the embodiments or the related art will be briefly described below. The drawings in the following description are some embodiments of the present disclosure. For those skilled in the art, other drawings may also be obtained based on these drawings.

DESCRIPTION OF EMBODIMENTS

In order to make the objectives, technical solutions and advantages of the embodiments of the present disclosure more clear, the technical solutions according to the embodiments of the present disclosure will be described below in conjunction with the drawings. The described embodiments are merely part of the embodiments of the present disclosure rather than all of the embodiments. Based on some embodiments of the present disclosure, all other embodiments obtained by those skilled in the art fall within the protection scope of the present disclosure.

The terms used in the embodiments of the present disclosure are merely for the purpose of describing specific embodiments and are not intended to limit the present disclosure. The singular forms of the terms "a", "said" and "the" used in the embodiments and the claims of the present disclosure are also intended to include plural forms unless the context clearly indicates otherwise.

The present disclosure provides an active anti-peeping display panel. A first light-emitting device and a second light-emitting device with different light-emitting angles are provided in the display panel, the first light-emitting device is used as an anti-peeping pixel, and the second light-emitting device is used as a shared pixel, so that the display panel can be switched between an anti-peeping mode and a sharing mode, thereby achieving an active anti-peeping solution. Light-guiding structures are provided on the first light-emitting device and/or the second light-emitting device, and the power consumption of the display panel is reduced by the light-guiding effect of the light-guiding structures.

Figure 1:
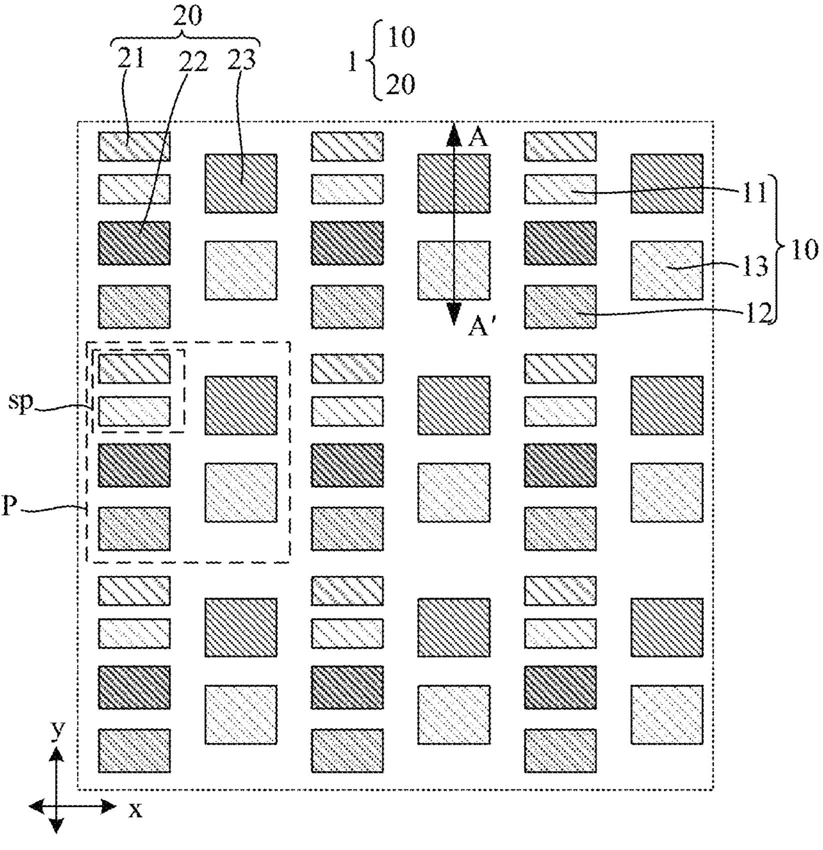
FIG. 1 is a schematic diagram of a display panel according to some embodiments of the present disclosure.
Figure 2:
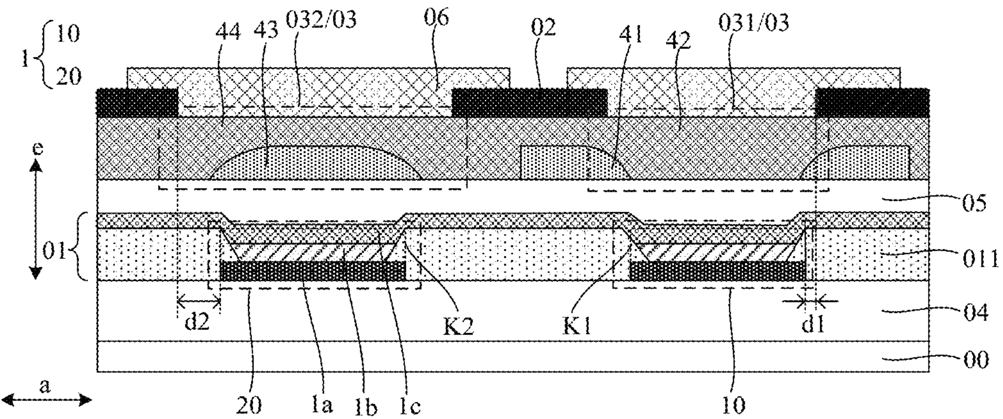
FIG. 2 is cross-sectional view of the cut-line A-A' shown in FIG. 1 according to some embodiments of the present disclosure.

FIG. 1 is a schematic diagram of a display panel according to some embodiments of the present disclosure. FIG. 2 is cross-sectional view of the cut-line A-A' shown in FIG. 1 according to some embodiments of the present disclosure. As shown in FIG. 1, light-emitting devices 1 of the display panel includes a first light-emitting device 10 and a second light-emitting device 20. The first light-emitting device 10 includes a first-color first light-emitting device 11, a second-color first light-emitting device 12 and a third-color first light-emitting device 13. The second light-emitting device 20 includes a first-color second light-emitting device 21, a second-color second light-emitting device 22 and a third-color second light-emitting device 23. The first-color first light-emitting device 11, the second-color first light-emitting device 12, and the third-color first light-emitting device 13 are one of a red light-emitting device, a green light-emitting device, and a blue light-emitting device, respectively. The first-color second light-emitting device 21 and the first-color first light-emitting device 11 have the same color, the second-color second light-emitting device 22 and the second-color first light-emitting device 12 have the same color, and the third-color second light-emitting device 23 and the third-color first light-emitting device 13 have the same color. The shape and arrangement of the light-emitting devices 1 in FIG. 1 are merely schematic representations and are not intended to limit the present disclosure. In some embodiments of the present disclosure, a shape of the light-emitting devices 1 may be circular, rectangular, other polygonal, or a profiled shape.

In conjunction with FIG. 2, the display panel includes a substrate 00, a display layer 01 is located on a side of the substrate 00, and a light-blocking structure 02 and light-guiding structures 03 are located on a side of the display layer 01 away from the substrate 00. The display layer 01 includes a pixel definition layer 011 and light-emitting devices 1. The pixel definition layer 011 includes a first opening K1 and a second opening K2. The first light-emitting device 10 is located in the first opening K1, and the second light-emitting device 20 is located in the second opening K2. The first light-emitting device 10 and the second light-emitting device 20 include a first electrode 1*a*, a light-emitting layer 1*b*, and a second electrode 1*c*, respectively. The first electrode 1*a* is an anode, and the second electrode 1*c* is a cathode. The display panel further includes a driving layer 04 and an encapsulation layer 05. A pixel circuit is provided in the driving layer 04. The pixel circuit is electrically connected to the first electrode 1*a*, and is configured to drive the light-emitting devices 1 to emit light. The encapsulation layer 05 is located on a side of the display layer 01 away from the substrate 00, and the encapsulation layer 05 is configured to isolate water and oxygen to protect the light-emitting devices 1. In some embodiments of the present disclosure, the encapsulation layer 05 includes at least one organic encapsulation layer and at least one inorganic encapsulation layer.

An orthographic projection of at least part of the light-blocking structure 02 on the substrate 00 is located between orthographic projections of two adjacent light-emitting devices 1 on the substrate 00. The display panel further includes a light-filtering unit 06. Along a direction e perpendicular to the plane of the substrate 00, the light-filtering unit 06 overlaps the light-emitting devices 1. The light-blocking structure 02 is configured to block light to prevent it from entering the display panel, which can prevent the metal structure in the driving layer 04 from reflecting ambient light, thereby reducing the reflectivity of the display panel. The light-filtering unit 06 can also play a role in reducing the reflectivity of the display panel. Along a first direction a, the distance between the light-blocking structure 02 and the first opening K1 is d1, the distance between the light-blocking structure 02 and the second opening K2 is d2, d1<d2, and the first direction a is parallel to a plane of the substrate 00. Since the light-blocking structure 02 has the function of blocking light, the distance between the light-blocking structure 02 and the opening of the pixel definition layer 011 affects the light-emitting angle of the light-emitting devices 1. In some embodiments of the present disclosure, the light-emitting angle of the first light-emitting device 10 is smaller than the light-emitting angle of the second light-emitting device 20. The light emitted by the second light-emitting device 20 can be emitted at a large angle, while the light-emitting angle of the first light-emitting device 10 is smaller. In applications, the first light-emitting device 10 can be used as an anti-peeping pixel, and the second light-emitting device 20 can be used as a shared pixel. By designing the distance between the first opening K1 and the light-blocking structure 02 and using the light-blocking structure 02 to block the lateral light emission of the first light-emitting device 10, the light emitted by the first light-emitting device 10 can be basically emitted in the front viewing direction of the display panel (i.e., a direction e perpendicular to the plane of the substrate 00). When the first light-emitting device 10 is turned on, the user cannot see the light of the first light-emitting device 10 in the large viewing direction, thereby achieving an anti-peeping effect.

As shown in FIG. 2, along the direction e perpendicular to the plane of the substrate 00, the first light-emitting device 10 at least partially overlaps the light-guiding structures 03, and the second light-emitting device 20 at least partially overlaps the light-guiding structures 03. In some embodiments of the present disclosure, the light-guiding structures 03 overlapping the first light-emitting device 10 is configured to converge light and emit more large-angle light from the front viewing direction, thereby increasing the brightness of the first light-emitting device 10 and reducing the power consumption. The light-guiding structures 03 overlapping the second light-emitting device 20 is configured to diffuse light so that more light is emitted at a larger angle, and the brightness is increased when viewed from a large viewing angle, thereby reducing the power consumption.

Figure 3:
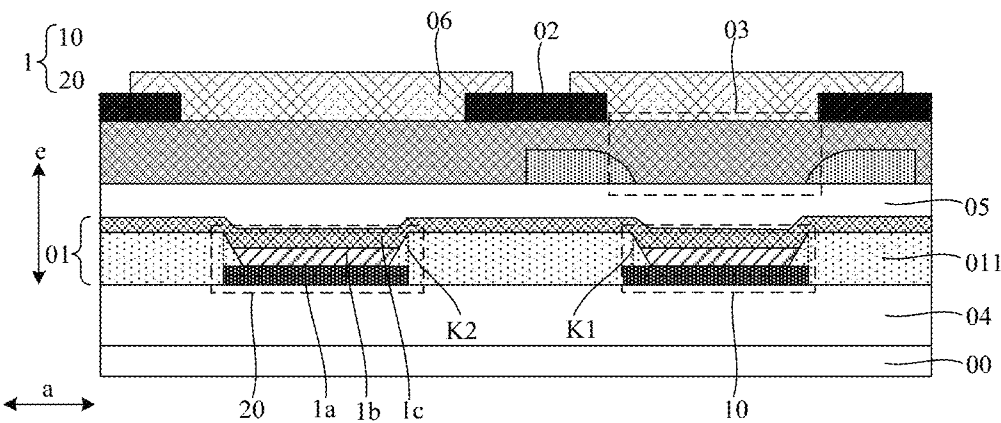
FIG. 3 is cross-sectional view of the cut-line A-A' shown in FIG. 1 according to some embodiments of the present disclosure.

As shown in FIG. 2, the first light-emitting device 10 and the second light-emitting device 20 at least partially overlap the light-guiding structures 03, respectively. In some embodiments of the present disclosure, FIG. 3 is cross-sectional view of the cut-line A-A' shown in FIG. 1. As shown in FIG. 3, along the direction e perpendicular to the plane of the substrate 00, the first light-emitting device 10 at least partially overlaps the light-guiding structures 03. No light-guiding structures 03 is provided above the second light-emitting device 20. In some embodiments of the present disclosure, along the direction e perpendicular to the plane of the substrate 00, the second light-emitting device 20 at least partially overlaps the light-guiding structures 03. No light-guiding structures 03 is provided above the first light-emitting device 10, which is not illustrated in the drawings.

In some embodiments of the present disclosure, by setting the distance between the light-blocking structure 02 and the opening of the pixel definition layer 011, the light-emitting angle of the first light-emitting device 10 is smaller than the light-emitting angle of the second light-emitting device 20. In application, the first light-emitting device 10 can be used as the anti-peeping pixel, the second light-emitting device 20 can be used as the shared pixel, and active anti-peeping is achieved when the first light-emitting device 10 is turned on. The light-guiding structures 03 are provided on a side of the display layer 01 away from the substrate 00. Along the direction e perpendicular to the plane of the substrate 00, the first light-emitting device 10 at least partially overlaps the light-guiding structures 03, and/or the second light-emitting device 20 at least partially overlaps the light-guiding structures 03. The light-guiding function of the light-guiding structures 03 can be used to reduce the power consumption of the display panel. For example, the light-guiding structures 03 overlapping the first light-emitting device 10 converge light and emit more large-angle light from the front viewing direction, the brightness of the first light-emitting device 10 can be increased and the power consumption of the display panel in the anti-peeping mode can be reduced; the light-guiding structures 03 overlapping the second light-emitting device 20 diffuse light and emits more light at a large angle, the brightness when the user views at a large viewing angle can be increased, and the power consumption of the display panel in the sharing mode can be reduced.

In some embodiments of the present disclosure, the display panel includes a first display mode and a second display mode. In the first display mode, the first light-emitting device 10 emits light, and the second light-emitting device 20 does not emit light. In the second display mode, the first light-emitting device 10 emits light, and the second light-emitting device 20 emits light. The first display mode is the anti-peeping mode, and the second display mode is the sharing mode. In the anti-peeping mode, only the first light-emitting device 10 emits light, thereby avoiding lateral light leakage and achieving the anti-peeping effect. In the sharing mode, both the first light-emitting device 10 and the second light-emitting device 20 emit light, which can meet the brightness requirement in the sharing mode and reduce the power consumption. Since the first light-emitting device 10 mainly emits light in the front viewing direction, the light-guiding structures 03 can increase the lateral light output of the second light-emitting device 20, thereby balancing the brightness difference between the front viewing direction and the direction of a large angle in the sharing mode and improving the overall display effect.

In some embodiments of the present disclosure, as shown in FIG. 2, along the first direction a, the distance between the light-blocking structure 02 and the first opening K1 is d1, the distance between the light-blocking structure 02 and the second opening K2 is d2, and 2 μm≤d2−d1≤5 μm. In some embodiments of the present disclosure, by setting the difference between d2 and d1 to within a certain range, the setting requirements for the difference in the light-emitting angles of the first light-emitting device 10 and the second light-emitting device 20 and the manufacturing process capabilities of the display panel can be balanced, and the second light-emitting device 20 with a larger light-emitting angle and the first light-emitting device 10 with a smaller light-emitting angle can be manufactured within an effective area space of the display panel, thereby achieving an active anti-peeping solution.

In some embodiments of the present disclosure, 1 μm≤d1≤2 μm, and 4 μm≤d2≤6 μm.

As shown in FIG. 2, the light-blocking structure 02 is located on a side of the light-guiding structures 03 away from the light-emitting devices 1. In some embodiments of the present disclosure, by using the light-blocking effect of the light-blocking structure 02 and setting the distance between the light-blocking structure 02 and the opening of the pixel definition layer 011, the light-emitting angle of the first light-emitting device 10 is smaller than the light-emitting angle of the second light-emitting device 20. The anti-peeping effect can be achieved when the first light-emitting device 10 is turned on. The light-guiding structures 03 are provided between the light-emitting devices 1 and a film layer of the light-blocking structure 02, and the light-guiding function of the light-guiding structures 03 is used to reduce the power consumption of the display panel.

For the first light-emitting device 10, the light emitted by it is converged by the light-guiding structures 03 so that more light is emitted from the front viewing direction, and the light output at a large viewing angle is blocked by the light-blocking structure 02, thereby achieving the anti-peeping effect and increasing the brightness of the first light-emitting device 10, which can reduce the power consumption of the display panel. The light-blocking structure 02 is provided on a side of the light-guiding structures 03 away from the light-emitting devices 1, so as to meet the application requirements of the first light-emitting device 10 as the anti-peeping pixel.

For the second light-emitting device 20, the light is diffused by the light-guiding structures 03 so that more light is emitted at a large angle. The distance between the light-blocking structure 02 and the second opening K2 is set large, and the light-blocking structure 02 will not affect the light emission at a large viewing angle, thereby increasing the brightness of the second light-emitting device 20 when viewed at a large viewing angle, and thus reducing the power consumption. The light-blocking structure 02 is provided on a side of the light-guiding structures 03 away from the light-emitting devices 1, and designed to match the distance between the light-blocking structure 02 and the second opening K2, so as to meet the application requirements of the second light-emitting device 20 as a shared pixel. In addition, when the first light-emitting device 10 and the second light-emitting device 20 are both provided with corresponding light-guiding structures 03, the space of the film layer of the light-guiding structures 03 can be reasonably utilized, thereby reducing the power consumption in both the anti-peeping mode and the sharing mode.

In some embodiments of the present disclosure, as shown in FIG. 2, the light-guiding structures 03 includes a first light-guiding structure 031 and a second light-guiding structure 032. Along the direction e perpendicular to the plane of the substrate 00, the first light-emitting device 10 at least partially overlaps the first light-guiding structure 031, and the second light-emitting device 20 at least partially overlaps the second light-guiding structure 032. The first light-guiding structure 031 includes a first refractive portion 41 and a second refractive portion 43 with different refractive indices, and the first refractive portion 41 is located on a side of the second refractive portion 42 adjacent to the substrate 00. The second light-guiding structure 032 includes a third refractive portion 43 and a fourth refractive portion 44 with different refractive indices, and the third refractive portion 43 is located on a side of the fourth refractive portion 44 adjacent to the substrate 00. In some embodiments of the present disclosure, the first refractive portion 41 and the third refractive portion 43 are made of a same material, and the second refractive portion 42 and the fourth refractive portion 44 are made of a same material. In some embodiments of the present disclosure, the first refractive portion 41 and the third refractive portion 43 can be manufactured in a same process, and the second refractive portion 42 and the fourth refractive portion 44 can be manufactured in the same process, that is, the first light-guiding structure 031 and the second light-guiding structure 032 can be manufactured at the same time when the display panel is manufactured. Not only can it reduce the power consumption in both the anti-peeping mode and the sharing mode, but also the process is simple.

In some embodiments shown in FIG. 2, the refractive index of the first refractive portion 41 is smaller than the refractive index of the second refractive portion 42, and the refractive index of the third refractive portion 43 is smaller than the refractive index of the fourth refractive portion 44. In some embodiments of the present disclosure, the refractive index of the first refractive portion 41 is greater than the refractive index of the second refractive portion 42, and the refractive index of the third refractive portion 43 is greater than the refractive index of the fourth refractive portion 44, which will be schematically illustrated in the drawings of the subsequent related embodiments.

Figure 4:
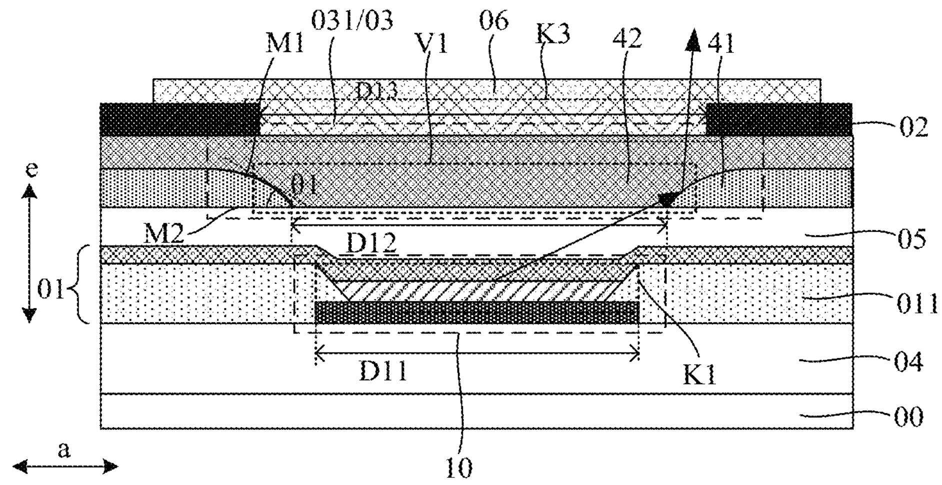
FIG. 4 is cross-sectional view of a display panel according to some embodiments of the present disclosure.

In some embodiments of the present disclosure, FIG. 4 is cross-sectional view of a display panel according to some embodiments of the present disclosure, and FIG. 4 only shows the cross-sectional view of the area where the first light-emitting device 10 is located. As shown in FIG. 4, the light-guiding structures 03 include the first light-guiding structure 031. Along the direction e perpendicular to the plane of the substrate 00, the first light-emitting device 10 at least partially overlaps the first light-guiding structure 031. The first light-guiding structure 031 includes the first refractive portion 41 and the second refractive portion 42 with different refractive indices, and the first refractive portion 41 is located on the side of the second refractive portion 42 adjacent to the substrate 00. The first refractive portion 41 has a first hollow V1, and at least part of the second refractive portion 42 is located in the first hollow V1. Along the direction perpendicular to the plane of the substrate 00, the first hollow V1 at least partially overlaps the first light-emitting device 10. In some embodiments of the present disclosure, the first refractive portion 41 and the second refractive portion 42 with different refractive indices are stacked to form the first light-guiding structure 031. The interface between the first refractive portion 41 and the second refractive portion 42 has a reflective effect on light, so that the large-angle light emitted by the first light-emitting device 10 and through the action of the first light-guiding structure 031 can be deflected in the front viewing direction, and the light is converged, thereby increasing the light output of the first light-emitting device 10 in the front viewing direction. The first light-emitting device 10 is applied as the anti-peeping pixel, the light-blocking structure 02 is used to block the lateral light emission of the first light-emitting device 10, and the first light-guiding structure 031 is used to increase the light output of the first light-emitting device 10 in the front viewing direction, thereby increasing the brightness of the first light-emitting device 10 and reducing the power consumption of the display panel in the anti-peeping mode.

As shown in FIG. 4, in the direction from a center of the first light-emitting device 10 to an edge of the first light-emitting device 10, the thickness of the first refractive portion 41 gradually increases. The refractive index of the first refractive portion 41 is smaller than the refractive index of the second refractive portion 42. FIG. 4 shows the light path of the large-angle light emitted by the first light-emitting device 10 and reflected at the interface between the first refractive portion 41 and the second refractive portion 42. The large-angle light emitted by the first light-emitting device 10 is emitted from the second refractive portion 42 to the first refractive portion 41 in the first hollow V1 of the first refractive portion 41, that is, from the optically dense medium to the optically thinner medium, the reflected light is deflected in the front viewing direction, and total reflection can occur when the incident angle is greater than or equal to the critical angle, which corresponds to converging the large-angle light emitted by the first light-emitting device 10 in the front viewing direction, thereby increasing the light output of the first light-emitting device 10 in the front viewing direction. The first light-emitting device 10 is applied as the anti-peeping pixel. The lateral light output of the first light-emitting device 10 is blocked by the light-blocking structure 02, while the light output of the first light-emitting device 10 in the front viewing direction is increased, thereby increasing the brightness of the first light-emitting device 10 and reducing the power consumption of the display panel in the anti-peeping mode.

Figure 5:
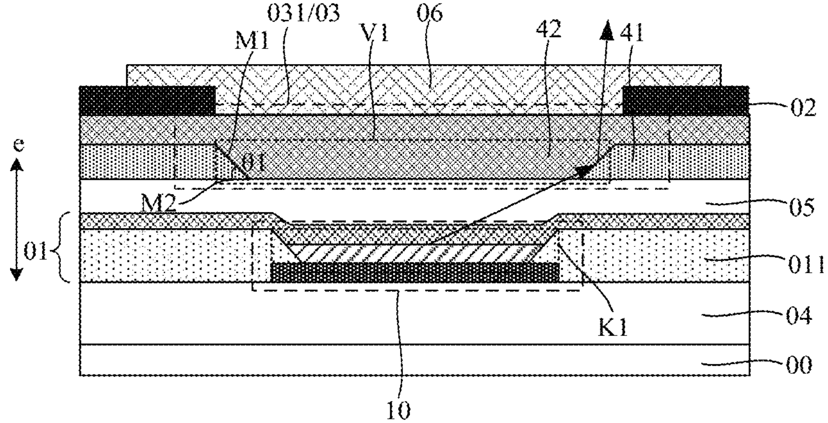
FIG. 5 is a schematic diagram of a display panel according to some embodiments of the present disclosure.

FIG. 4 shows that a side wall of the first hollow V1 of the first refractive portion 41 in the cross-sectional view is a curved surface. In some embodiments of the present disclosure, FIG. 5 is a schematic diagram of a display panel according to some embodiments of the present disclosure. As shown in FIG. 5, in the direction from the center of the first light-emitting device 10 to the edge of the first light-emitting device 10, the thickness of the first refractive portion 41 gradually increases. In the cross-sectional view, the side wall of the first hollow V1 of the first refractive portion 41 is an inclined surface.

As shown in FIG. 4, the first refractive portion 41 has a first side surface M1 and a first bottom surface M2. In the direction from the center of the first light-emitting device 10 to the edge of the first light-emitting device 10, the distance between the first side surface M1 and the first bottom surface M2 gradually increases. The angle formed by the first side surface M1 and the first bottom surface M2 and facing the first refractive portion 41 is θ1, and 30°≤θ1≤70°. When the first side surface M1 is the curved surface, the angle θ1 is defined by the angle formed by the tangent line of the first side surface M1 and the first bottom surface M2. When the first side surface M1 is the inclined surface as shown in FIG. 5, the angle θ1 is defined by a slope angle formed by the first side surface M1 and the first bottom surface M2. In some embodiments of the present disclosure, the large-angle light emitted by the first light-emitting device 10 is reflected at the interface between the first refractive portion 41 and the second refractive portion 42 to deflect the light in the front viewing direction, thereby increasing the light output of the first light-emitting device 10 in the front viewing direction. By setting 30°≤θ1≤70°, the proportion of large-angle light that can be deflected in the front viewing direction is relatively large, that is, most of the large-angle light emitted by the first light-emitting device 10 can be deflected toward the front viewing direction through the action of the first light-guiding structure 031, thereby increasing the brightness of the first light-emitting device 10 more effectively.

In some embodiments of the present disclosure, as shown in FIG. 4, along the first direction a, the width of the first opening K1 is D11, and the width of the first hollow V1 is D12. The light-blocking structure 02 has a third opening K3. Along the direction e perpendicular to the plane of the substrate 00, the third opening K3 at least partially overlaps the first light-emitting device 10. Along the first direction a, the width of the third opening K3 is D13. In some embodiments of the present disclosure, D13≥D12>D11. Since the thickness of the first refractive portion 41 gradually increases in the direction from the center of the first light-emitting device 10 to the edge of the first light-emitting device 10, along the direction perpendicular to the plane of the substrate 00, the width of the first hollow V1 along the first direction a gradually changes, and the width D12 of the first hollow V1 is calculated based on the width of the side adjacent to the substrate 00.

For the three parameters related to the first light-emitting device 10, namely, the width D11 of the first opening K1, the width D12 of the first hollow V1, and the width D13 of the third opening K3, setting the width D11 of the first opening K1 to be the smallest is conducive to reasonably using the space on the entire surface of the display panel for providing the light-emitting devices and achieving the pixel density per unit area of the display panel. For example, the size of the first light-emitting device 10 can be set smaller than the size of the second light-emitting device 20. By setting D12>D11, the first light-guiding structure 031 can fully utilize the large-angle light emitted by the first light-emitting device 10, so that the brightness of the first light-emitting device 10 is further improved and the power consumption is reduced better. By setting D13≥D12, it can be ensured that after the light passes through the first light-guiding structure 031, the light-blocking structure 02 is used to block the lateral light output of the first light-emitting device 10, so that the first light-emitting device 10 can be applied as the anti-peeping pixel.

Figure 6:
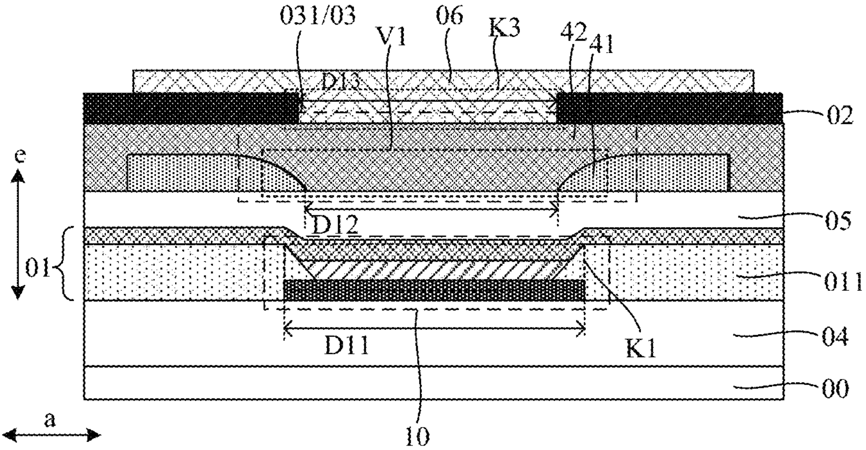
FIG. 6 is a schematic diagram of a display panel according to some embodiments of the present disclosure.

In some embodiments of the present disclosure, FIG. 6 is a schematic diagram of a display panel according to some embodiments of the present disclosure. FIG. 6 shows a cross-sectional view of the location of the first light-emitting device 10. As shown in FIG. 6, along the first direction a, the width of the first opening K1 is D11, the width of the first hollow V1 is D12, and the width of the third opening K3 of the light-blocking structure 02 is D13. In some embodiments of the present disclosure, D11>D12≥D13. For the three parameters related to the first light-emitting device 10, namely, the width D11 of the first opening K1, the width D12 of the first hollow V1, and the width D13 of the third opening K3, the width D11 of the first opening K1 is set to be the largest, the overall light output of the first light-emitting device 10 is large, and more light is output at a large angle. Setting D11>D12 enables the first light-guiding structure 031 above the first light-emitting device 10 to act on more light, so that the brightness of the first light-emitting device 10 is further improved and the power consumption is reduced better. By setting D12≥D13, the light-blocking structure 02 above the first light-guiding structure 031 is used to block the lateral light output, thereby increasing the light output in the front viewing direction of the first light-emitting device 10 and meeting its application requirements upon being the anti-peeping pixel. In addition, the width D11 of the first opening K1 is set to be the largest. In some embodiments of the present disclosure, the first light-emitting device 10 and the second light-emitting device 20 may have the same corresponding opening size and do not need to be set differently, thereby reducing the difficulty of the process.

Figure 7:
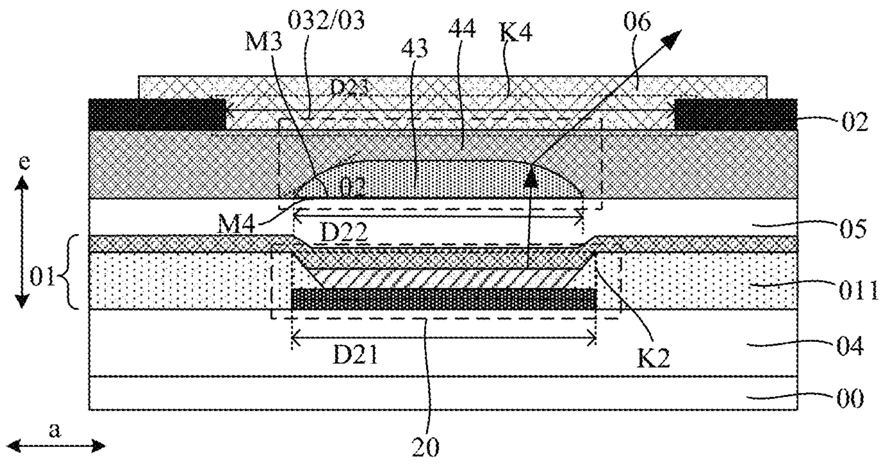
FIG. 7 is a schematic diagram of a display panel according to some embodiments of the present disclosure.

In some embodiments of the present disclosure, FIG. 7 is a schematic diagram of a display panel according to some embodiments of the present disclosure. FIG. 7 shows a cross-sectional view of the location of the second light-emitting device 20. The light-guiding structure 03 includes the second light-guiding structure 032. Along the direction e perpendicular to the plane of the substrate 00, the second light-emitting device 20 at least partially overlaps the second light-guiding structure 032. The second light-guiding structure 032 includes the third refractive portion 43 and the fourth refractive portion 44 with different refractive indices. The third refractive portion 43 is located on the side of the fourth refractive portion 44 adjacent to the substrate 00. Along the direction e perpendicular to the plane of the substrate 00, the third refractive portion 43 at least partially overlaps the second light-emitting device 20. In some embodiments of the present disclosure, the third refractive portion 43 and the fourth refractive portion 44 with different refractive indices are stacked to form the second light-guiding structure 032. The interface between the third refractive portion 43 and the fourth refractive portion 44 has a refractive effect on the light, so that the light emitted by the second light-emitting device 20 and through the action of the second light-guiding structure 032 is deflected in a large-angle direction, and the light is diffused, thereby increasing the lateral light output of the second light-emitting device 20. The second light-emitting device 20 is applied as the shared pixel. By adjusting the distance between the light-blocking structure 02 and the second opening K2, it can be ensured that the lateral light output of the second light-emitting device 20 is not blocked. By increasing the lateral light output of the second light-emitting device 20 through the second light-guiding structure 032, the brightness when viewed from a large viewing angle can be improved, thereby reducing the power consumption. In addition, in some embodiments of the present disclosure, the first light-emitting device 10 and the second light-emitting device 20 are both configured to emit light in the sharing mode, the first light-guiding structure 031 increases the light output in the front viewing direction of the first light-emitting device 10, and the second light-guiding structure 032 increases the lateral light output of the second light-emitting device 20, thereby balancing the brightness difference between the front viewing direction and the direction of a large viewing angle in the sharing mode and improving the overall display effect.

As shown in FIG. 7, in a direction from a center of the second light-emitting device 20 to an edge of the second light-emitting device 20, the thickness of the third refractive portion 43 gradually decreases. The refractive index of the third refractive portion 43 is smaller than the refractive index of the fourth refractive portion 44. FIG. 7 shows the optical path of the light emitted by the second light-emitting device 20 and refracted at the interface between the third refractive portion 43 and the fourth refractive portion 44. The light emitted by the second light-emitting device 20 is directed from the third refractive portion 43 to the fourth refractive portion 44, that is, from the optically thinner medium to the optically dense medium. The refraction angle is greater than the incident angle, so that the light is deflected laterally, in other words, deflected in the direction of a large viewing angle, thereby increasing the light output of the second light-emitting device 20 at a large viewing angle. The second light-emitting device 20 is applied as the shared pixel to increase the lateral light output of the second light-emitting device 20, thereby increasing the brightness of the second light-emitting device 20 at a large viewing angle, which can reduce the power consumption in the sharing mode and improve the display effect when viewed at a large viewing angle.

Figure 8:
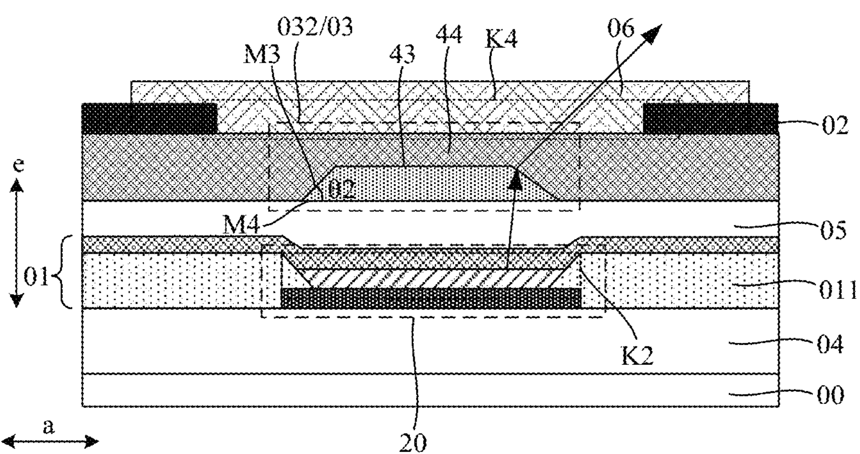
FIG. 8 is a schematic diagram of a display panel according to some embodiments of the present disclosure.

FIG. 7 shows that a second side surface M3 of an edge portion of the third refractive portion 43 in the cross-sectional view is a curved surface. In some embodiments of the present disclosure, FIG. 8 is a schematic diagram of a display panel according to some embodiments of the present disclosure. As shown in FIG. 8, in the direction from the center of the second light-emitting device 20 to the edge of the second light-emitting device 20, the thickness of the third refractive portion 43 gradually decreases. In the cross-sectional view, the second side surface M3 of the edge portion of the third refractive portion 43 is an inclined surface.

As shown in FIG. 7, the third refractive portion 43 has the second side surface M3 and a second bottom surface M4. In the direction from the center of the second light-emitting device 20 to the edge of the second light-emitting device 20, the distance between the second side surface M3 and the second bottom surface M4 gradually decreases. The angle formed by the second side surface M3 and the second bottom surface M4 and facing the third refractive portion 43 is θ2, and 30°≤θ2≤70°. When the second side surface M3 is the curved surface, the angle θ2 is defined by the angle formed by a tangent line of the second side surface M3 and the second bottom surface M4. When the second side surface M3 is the inclined surface as shown in FIG. 8, the angle θ2 is defined by a slope angle formed by the second side surface M3 and the second bottom surface M4. In some embodiments of the present disclosure, the large-angle light emitted by the second light-emitting device 20 is reflected at the interface between the third refractive portion 43 and the fourth refractive portion 44 to deflect the light in the large viewing direction, thereby increasing the light output of the second light-emitting device 20 in the large viewing direction. By setting 30°≤θ2≤70°, the proportion of light that can be deflected in a large viewing angle is relatively large, thereby increasing the brightness of the second light-emitting device 20 more effectively at a large viewing angle.

As shown in FIG. 7, along the first direction a, the width of the second opening K2 is D21, and the width of the third refractive portion 43 is D22. The light-blocking structure 02 has a fourth opening K4, and along the direction e perpendicular to the plane of the substrate 00, the fourth opening K4 at least partially overlaps the second light-emitting device 20. Along the first direction a, the width of the fourth opening is D23. In some embodiments of the present disclosure, D23>D22≥D21. The first direction a is parallel to the direction of the plane of the substrate 00. For the three parameters related to the second light-emitting device 20, namely, the width D21 of the second opening K2, the width D22 of the third refractive portion 43, and the width D23 of the fourth opening K4, the width D23 of the fourth opening K4 is set to be the largest, and the light-emitting angle of the second light-emitting device 20 is controlled by adjusting the distance between the light-blocking structure 02 and the second opening K2, so as to ensure the effect of the second light-emitting device 20 being the shared pixel. By setting D22-D21, the light emitted by the second light-emitting device 20 can be fully used, so that the second light-emitting device 20 diffuses more light at a large angle, which has a better effect on improving the brightness of the second light-emitting device 20 at a large viewing angle.

Figure 9:
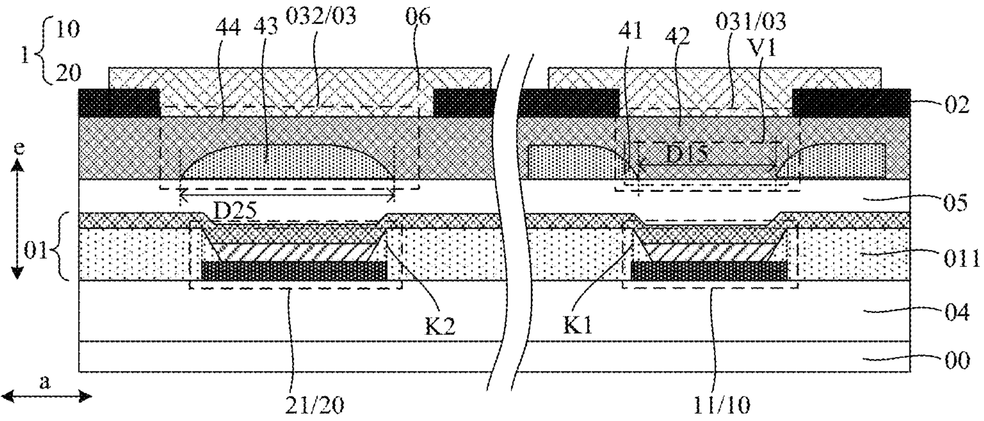
FIG. 9 is a schematic diagram of a display panel according to some embodiments of the present disclosure.

In some embodiments of the present disclosure, FIG. 9 is a schematic diagram of a display panel according to some embodiments of the present disclosure. As shown in FIG. 9, the first light-emitting device 10 includes a first-color first light-emitting device 11, and the second light-emitting device 20 includes a first-color second light-emitting device 21, and the first-color first light-emitting device 11 and the first-color second light-emitting device 21 have the same color. Along the direction e perpendicular to the plane of the substrate 00, the first-color first light-emitting device 11 overlaps the first light-guiding structure 031, and the first-color second light-emitting device 21 overlaps the second light-guiding structure 032. Along the direction e perpendicular to the plane of the substrate 00, the width of the first hollow V1 overlapping the first-color first light-emitting device 11 in the first direction a is D15, and along the direction e perpendicular to the plane of the substrate 00, the width of the third refractive portion 43 overlapping the first-color second light-emitting device 21 in the first direction a is D25, and D25>D15. The first light-guiding structure 031 and the second light-guiding structure 032 have different functions, and the structural dimensions of the light-guiding structures 03 are designed according to the sizes of the two light-emitting devices and the functions of the two light-guiding structures 03. By setting D25>D15, the first light-guiding structure 031 above the first-color first light-emitting device 11 has the function of converging light, and the second light-guiding structure 032 above the first-color second light-emitting device 21 has the function of diffusing light.

Figure 10:
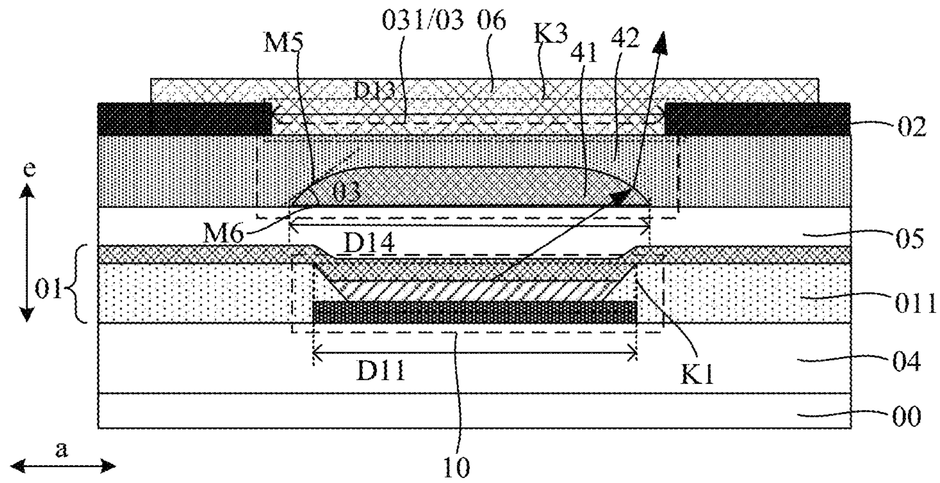
FIG. 10 is a schematic diagram of a display panel according to some embodiments of the present disclosure.

In some embodiments of the present disclosure, FIG. 10 is a schematic diagram of a display panel according to some embodiments of the present disclosure. FIG. 10 shows the location of the first light-emitting device 10. As shown in FIG. 10, the light-guiding structures 03 includes a first light-guiding structure 031. Along the direction e perpendicular to the plane of the substrate 00, the first light-emitting device 10 at least partially overlaps the first light-guiding structure 031. The first light-guiding structure 031 includes the first refractive portion 41 and the second refractive portion 42 with different refractive indices, and the first refractive portion 41 is located on the side of the second refractive portion 42 adjacent to the substrate 00. Along the direction e perpendicular to the plane of the substrate 00, the first refractive portion 41 at least partially overlaps the first light-emitting device 10. In some embodiments of the present disclosure, the first refractive portion 41 and the second refractive portion 42 with different refractive indices are stacked to form the first light-guiding structure 031. The interface between the first refractive portion 41 and the second refractive portion 42 has a refractive effect on light, so that the large-angle light emitted by the first light-emitting device 10 and through the action of the first light-guiding structure 031 can be deflected in the front viewing direction, and the light is converged, thereby increasing the light output of the first light-emitting device 10 in the front viewing direction. The first light-emitting device 10 is applied as the anti-peeping pixel, the light-blocking structure 02 is used to block the lateral light emission of the first light-emitting device 10, and the first light-guiding structure 031 is used to increase the light output of the first light-emitting device 10 in the front viewing direction, thereby increasing the brightness of the first light-emitting device 10 and reducing the power consumption of the display panel in the anti-peeping mode.

As shown in FIG. 10, in the direction from the center of the first light-emitting device 10 to the edge of the first light-emitting device 10, the thickness of the first refractive portion 41 gradually decreases. The refractive index of the first refractive portion 41 is greater than the refractive index of the second refractive portion 42. FIG. 10 shows the optical path of the large-angle light emitted by the first light-emitting device 10 and refracted at the interface between the first refractive portion 41 and the second refractive portion 42. The large-angle light emitted by the first light-emitting device 10 is incident from the first refractive portion 41 to the second refractive portion 42, that is, from the optically dense medium to the optically thinner medium. The refraction angle is greater than the incident angle, so that the refracted light is deflected in the front viewing direction, which corresponds to converging the large-angle light emitted by the first light-emitting device 10 in the front viewing direction, thereby increasing the light output of the first light-emitting device 10 in the front viewing direction. The first light-emitting device 10 is applied as the anti-peeping pixel. The lateral light output of the first light-emitting device 10 is blocked by the light-blocking structure 02, while the light output of the first light-emitting device 10 in the front viewing direction is increased, thereby increasing the brightness of the first light-emitting device 10 and reducing the power consumption of the display panel in the anti-peeping mode.

FIG. 10 shows that a side wall of an edge portion of the first refractive portion 41 is a curved surface. In some embodiments of the present disclosure, the side wall of the edge portion of the first refractive portion 41 is an inclined surface, and the shape of the first refractive portion 41 is similar to the shape of the third refractive portion 43 shown in FIG. 8.

As shown in FIG. 10, the third refractive portion 43 has a third side surface M5 and a third bottom surface M6. In the direction from the center of the first light-emitting device 10 to the edge of the first light-emitting device 10, the distance between the third side surface M5 and the third bottom surface M6 gradually decreases. The angle formed by the third side surface M5 and the third bottom surface M6 and facing the third refractive portion 43 is θ3, and $30° \leq θ3 \leq 70°$. When the third side surface M5 is a curved surface, the angle θ3 is defined by the angle formed by a tangent line of the third side surface M5 and the third bottom surface M6. When the third side surface M5 is the inclined surface, the angle θ3 is defined by a slope angle formed by the third side surface M5 and the third bottom surface M6. In some embodiments of the present disclosure, the large-angle light emitted by the first light-emitting device 10 is refracted at the interface between the first refractive portion 41 and the second refractive portion 42 to deflect the light in the front viewing direction, thereby increasing the light output of the first light-emitting device 10 in the front viewing direction. By setting $30° \leq θ3 \leq 70°$, the proportion of large-angle light that can be deflected in the front viewing direction is relatively large, that is, most of the large-angle light emitted by the first light-emitting device 10 can be deflected toward the front viewing direction through the action of the first light-guiding structure 031, thereby increasing the brightness of the first light-emitting device 10 more effectively.

As shown in FIG. 10, along the first direction a, the width of the first opening K1 is D11, and the width of the first refractive portion 41 is D14. The light-blocking structure 02 has the third opening K3, and the third opening K3 at least partially overlaps the first light-emitting device 10 in a direction perpendicular to the plane of the substrate 00. Along the direction e perpendicular to the plane of the substrate 00, the third opening K3 at least partially overlaps the first light-emitting device 10. Along the first direction a, the width of the third opening K3 is D13. In some embodiments of the present disclosure, $D13 \geq D14 > D11$. For the three parameters related to the first light-emitting device 10, namely, the width D11 of the first opening K1, the width D14 of the first refractive portion 41, and the width D13 of the third opening K3, setting the width D11 of the first opening K1 to be the smallest is conducive to reasonably using the space on the entire surface of the display panel for providing the light-emitting devices and achieving the pixel density per unit area of the display panel. For example, the size of the first light-emitting device 10 can be set smaller than the size of the second light-emitting device 20. By setting $D14 > D11$, the first light-guiding structure 031 can fully utilize the large-angle light emitted by the first light-emitting device 10, so that the brightness of the first light-emitting device 10 is further improved and the power consumption is reduced better. By setting $D13 \geq D14$, it can be ensured that after the light passes through the first light-guiding structure 031, the light-blocking structure 02 is used to block the lateral light output of the first light-emitting device 10, so that the first light-emitting device 10 can be applied as the anti-peeping pixel.

Figure 11:
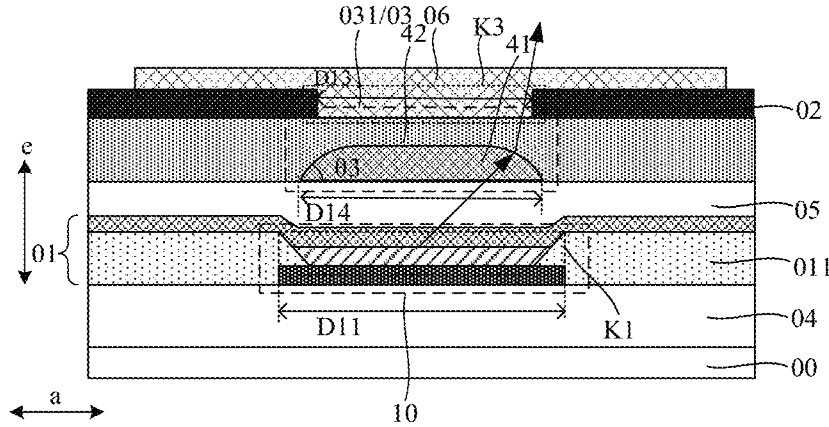
FIG. 11 is a schematic diagram of a display panel according to some embodiments of the present disclosure.

In some embodiments of the present disclosure, FIG. 11 is a schematic diagram of a display panel according to some embodiments of the present disclosure. FIG. 11 shows a cross-sectional view of the location of the first light-emitting device 10. As shown in FIG. 11, along the first direction a, the width of the first opening K1 is D11, the width of the first refractive portion 41 is D14, and the width of the third opening K3 of the light-blocking structure 02 is D13. In some embodiments of the present disclosure, $D11 > D14 \geq D13$. The width D11 of the first opening K1 is set to be the largest, the overall light output of the first light-emitting device 10 is large, and more light is output at a large angle. Setting $D11 > D14$ enables the first light-guiding structure 031 above the first light-emitting device 10 to act on more light, so that the brightness of the first light-emitting device 10 is further improved and the power consumption is reduced better. By setting $D14 \geq D13$, the light-blocking structure 02 above the first light-guiding structure 031 is used to block the lateral light output, thereby increasing the light output in the front viewing direction of the first light-emitting device 10 and meeting its application requirements upon being the anti-peeping pixel. In addition, the width D11 of the first opening K1 is set to be the largest. In some embodiments of the present disclosure, the first light-emitting device 10 and the second light-emitting device 20 may have the same corresponding opening size and do not need to be set differently, thereby reducing the difficulty of the process.

Figure 12:
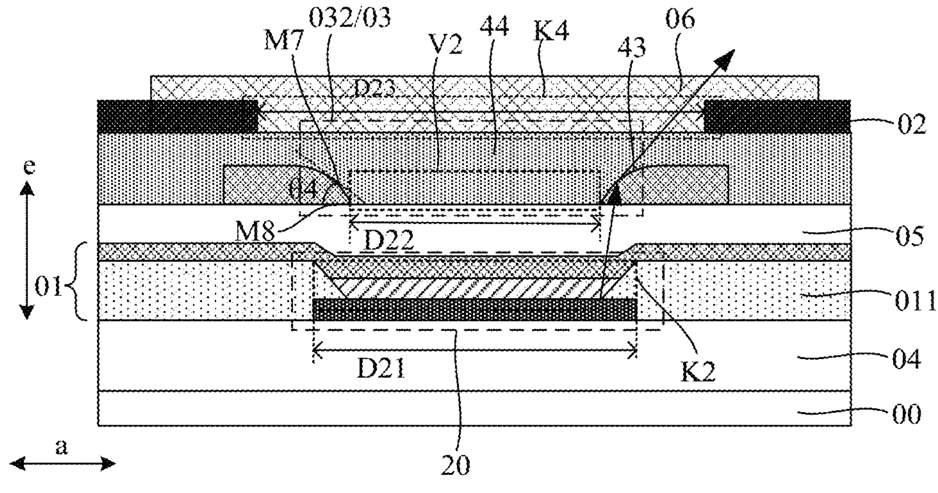
FIG. 12 is a schematic diagram of a display panel according to some embodiments of the present disclosure.

In some embodiments of the present disclosure, FIG. 12 is a schematic diagram of a display panel according to some embodiments of the present disclosure. FIG. 12 shows a cross-sectional view of the location of the second light-emitting device 20. As shown in FIG. 12, the light-guiding structure 03 includes the second light-guiding structure 032. Along the direction e perpendicular to the plane of the substrate 00, the second light-emitting device 20 at least partially overlaps the second light-guiding structure 032. The second light-guiding structure 032 includes the third refractive portion 43 and the fourth refractive portion 44 with different refractive indices. The third refractive portion 43 is located on the side of the fourth refractive portion 44 adjacent to the substrate 00. The third refractive portion 43 has a second hollow V2, and at least part of the fourth refractive portion 44 is located in the second hollow V2. Along the direction e perpendicular to the plane of the substrate 00, the second hollow V2 at least partially overlaps the second light-emitting device 20. In some embodiments of the present disclosure, the third refractive portion 43 and the fourth refractive portion 44 with different refractive indices are stacked to form the second light-guiding structure 032. The interface between the third refractive portion 43 and the fourth refractive portion 44 has a refraction effect on light, so that the light emitted by the second light-emitting device 20 and through the action of the second light-guiding structure 032 is deflected in a large-angle direction, and the light is diffused, thereby increasing the lateral light output of the second light-emitting device 20. The second light-emitting device 20 is applied as the shared pixel. By adjusting the distance between the light-blocking structure 02 and the second opening K2, it can be ensured that the lateral light output of the second light-emitting device 20 is not blocked. By increasing the lateral light output of the second light-emitting device 20 through the second light-guiding structure 032, the brightness when viewed from a large viewing angle can be improved, thereby reducing the power consumption. In addition, in some embodiments of the present disclosure, the first light-emitting device 10 and the second light-emitting device 20 are both configured to emit light in the sharing mode, the first light-guiding structure 031 increases the light output in the front viewing direction of the first light-emitting device 10, and the second light-guiding structure 032 increases the lateral light output of the second light-emitting device 20, thereby balancing the brightness difference between the front viewing direction and the direction of a large viewing angle in the sharing mode and improving the overall display effect.

As shown in FIG. 12, in the direction from the center of the second light-emitting device 20 to the edge of the second light-emitting device 20, the thickness of the third refractive portion 43 gradually increases. The refractive index of the third refractive portion 43 is greater than the refractive index of the fourth refractive portion 44. FIG. 12 shows the optical path of the light emitted by the second light-emitting device 20 and refracted at the interface between the third refractive portion 43 and the fourth refractive portion 44. The light emitted by the second light-emitting device 20 is directed from the third refractive portion 43 to the fourth refractive portion 44, that is, from the optically dense medium to the optically thinner medium. The refraction angle is smaller than the incident angle, so that the light is deflected laterally, thereby increasing the light output of the second light-emitting device 20 at a large viewing angle. The second light-emitting device 20 is applied as the shared pixel to increase the lateral light output of the second light-emitting device 20, thereby increasing the brightness of the second light-emitting device 20 at a large viewing angle, which can reduce the power consumption in the sharing mode and improve the display effect when viewed at a large viewing angle.

As shown in FIG. 12, the third refractive portion 43 has a fourth side surface M7 and a fourth bottom surface M8. In the direction from the center of the second light-emitting device 20 to the edge of the second light-emitting device 20, the distance between the fourth side surface M7 and the fourth bottom surface M8 gradually increases. The angle formed by the fourth side surface M7 and the fourth bottom surface M8 and facing the third refractive portion 43 is θ4, and $30° \leq θ4 \leq 70°$. FIG. 12 shows that the fourth side surface M7 is a curved surface, and the angle θ4 is defined by the angle formed by a tangent line of the fourth side surface M7 and the fourth bottom surface M8. In some embodiments of the present disclosure, the fourth side surface M7 is an inclined surface, and the angle θ4 is defined by a slope angle formed by the fourth side surface M7 and the fourth bottom surface M8. In some embodiments of the present disclosure, the large-angle light emitted by the second light-emitting device 20 is reflected at the interface between the third refractive portion 43 and the fourth refractive portion 44 to deflect the light in the large viewing direction, thereby increasing the light output of the second light-emitting device 20 in the large viewing direction. By setting $30° \leq θ2 \leq 70°$, the proportion of light that can be deflected in a large viewing angle is relatively large, thereby increasing the brightness of the second light-emitting device 20 more effectively at a large viewing angle.

As shown in FIG. 12, along the first direction a, the width of the second opening K2 is D21, and the width of the second hollow V2 is D22. The light-blocking structure 02 has a fourth opening K4, and along the direction e perpendicular to the plane of the substrate 00, the fourth opening K4 at least partially overlaps the second light-emitting device 20. Along the first direction a, the width of the fourth opening K4 is D23. In some embodiments of the present disclosure, $D23 > D22 \geq D21$. By setting $D21 \geq D22$, the second light-guiding structure 032 can fully use the light emitted by the second light-emitting device 20, and make the second light-emitting device 20 diffuse more light at a large angle, thereby improving the brightness of the second light-emitting device 20 at a large viewing angle. By setting $D23 > D21$, the light-emitting angle of the second light-emitting device 20 can be controlled by adjusting the distance between the light-blocking structure 02 and the second opening K2, so as to ensure the effect of the second light-emitting device 20 being the shared pixel.

Figure 13:
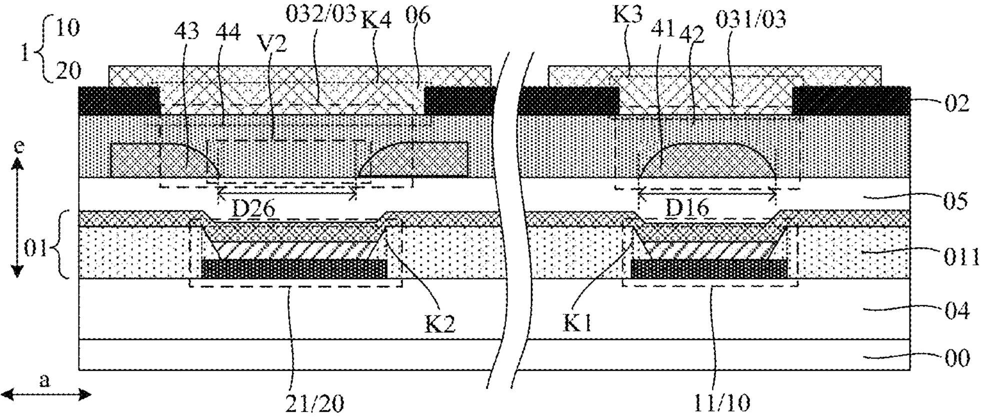
FIG. 13 is a schematic diagram of a display panel according to some embodiments of the present disclosure.

In some embodiments of the present disclosure, FIG. 13 is a schematic diagram of a display panel according to some embodiments of the present disclosure. As shown in FIG. 13, the first light-emitting device 10 includes the first-color first light-emitting device 11, and the second light-emitting device 20 includes the first-color second light-emitting device 21, and the first-color first light-emitting device 11 and the first-color second light-emitting device 21 have the same color. Along the direction e perpendicular to the plane of the substrate 00, the first-color first light-emitting device 11 overlaps the first light-guiding structure 031, and the first-color second light-emitting device 21 overlaps the second light-guiding structure 032. Along the direction e perpendicular to the plane of the substrate 00, the width of the first refractive portion 41 overlapping the first-color first light-emitting device 11 in the first direction a is D16, and along the direction e perpendicular to the plane of the substrate 00, the width of the second hollow V2 overlapping the first-color second light-emitting device 21 in the first direction a is D26, and D26>D16. The first light-guiding structure 031 and the second light-guiding structure 032 have different functions, and the structural dimensions of the light-guiding structures 03 are designed according to the sizes of the two light-emitting devices and the functions of the two light-guiding structures 03. By setting D26>D16, the first light-guiding structure 031 above the first-color first light-emitting device 11 has the function of converging light, and the second light-guiding structure 032 above the first-color second light-emitting device 21 has the function of diffusing light.

As shown in FIG. 13, the light-blocking structure 02 has the third opening K3 and the fourth opening K4. Along the direction e perpendicular to the plane of the substrate 00, the third opening K3 at least partially overlaps the first light-emitting device 10, and the fourth opening K4 at least partially overlaps the second light-emitting device 20. The first light-emitting device 10 includes the first-color first light-emitting device 11, and the second light-emitting device 20 includes the first-color second light-emitting device 21, and the first-color first light-emitting device 11 and the first-color second light-emitting device 21 have the same color. In some embodiments of the present disclosure, an area of the third opening K3 overlapping the first-color first light-emitting device 11 is smaller than an area of the fourth opening K4 overlapping the first-color second light-emitting device 21. In pixels of the same color, the above arrangement enables the light-emitting area of the shared pixel to be larger than the light-emitting area of the anti-peeping pixel. In general, the usage time of the sharing mode is longer than that of the anti-peeping mode, the light-emitting areas of the two pixels are reasonably designed according to the application scenario, which can make reasonable use of the space of the entire display area and ensure the number of pixels per unit area of the display panel.

In some embodiments of the present disclosure, as shown in FIG. 13, the first light-emitting device 10 includes the first-color first light-emitting device 11, and the second light-emitting device 20 includes the first-color second light-emitting device 21, and the first-color first light-emitting device 11 and the first-color second light-emitting device 21 have the same color. Along the first direction a, the width of the first opening K1 corresponding to the first-color first light-emitting device 11 is smaller than the width of the second opening K2 corresponding to the first-color second light-emitting device 21. The area of the first opening K1 corresponding to the first-color first light-emitting device 11 is set to be smaller than the area of the second opening K2 corresponding to the first-color second light-emitting device 21. In pixels of the same color, the above arrangement can make the light-emitting area of the shared pixel larger than the light-emitting area of the anti-peeping pixel. In general, the usage time of the sharing mode is longer than that of the anti-peeping mode, the light-emitting areas of the two pixels are reasonably designed according to the application scenario, and the area of the second opening K2 is set large, which can reduce the current density of the second light-emitting device 20, thereby increasing the service life of the second light-emitting device 20.

Figure 14:
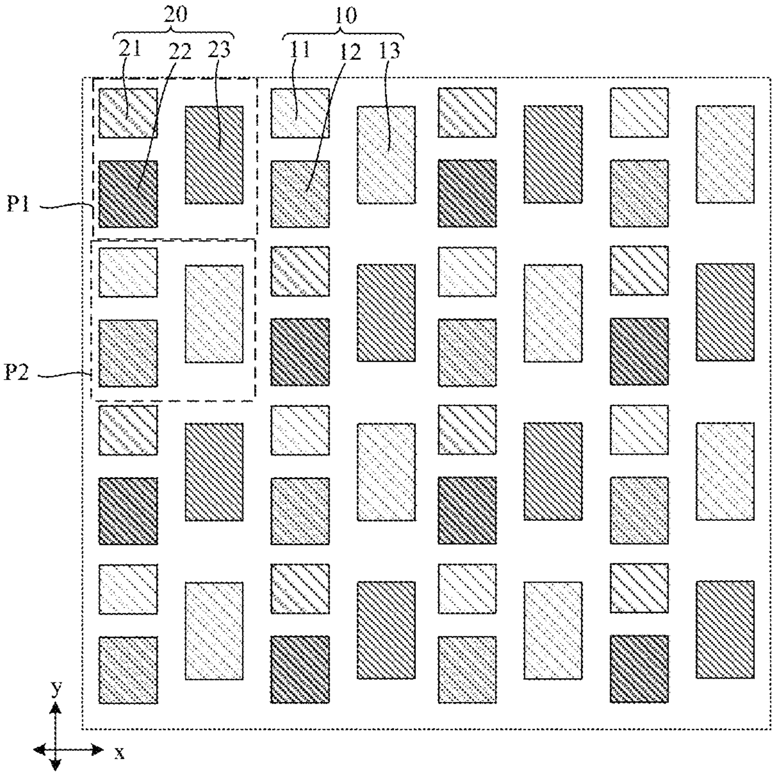
FIG. 14 is a schematic diagram of a display panel according to some embodiments of the present disclosure.

In some embodiments of the present disclosure, FIG. 14 is a schematic diagram of a display panel according to some embodiments of the present disclosure. As shown in FIG. 14, the first light-emitting device 10 includes the first-color first light-emitting device 11, the second-color first light-emitting device 12 and the third-color first light-emitting device 13. The second light-emitting device 20 includes the first-color second light-emitting device 21, the second-color second light-emitting device 22 and the third-color second light-emitting device 23. The display panel includes a first pixel area P1 and a second pixel area P2. The first pixel area P1 includes at least two first light-emitting devices 10 of different colors, and the second pixel area P2 includes at least two second light-emitting devices 20 of different colors. The first pixel area P1 and the second pixel area P2 are alternated along a second direction x, and the first pixel area P1 and the second pixel area P2 are alternated along a third direction y. The second direction x and the third direction y intersect each other.

Figure 15:
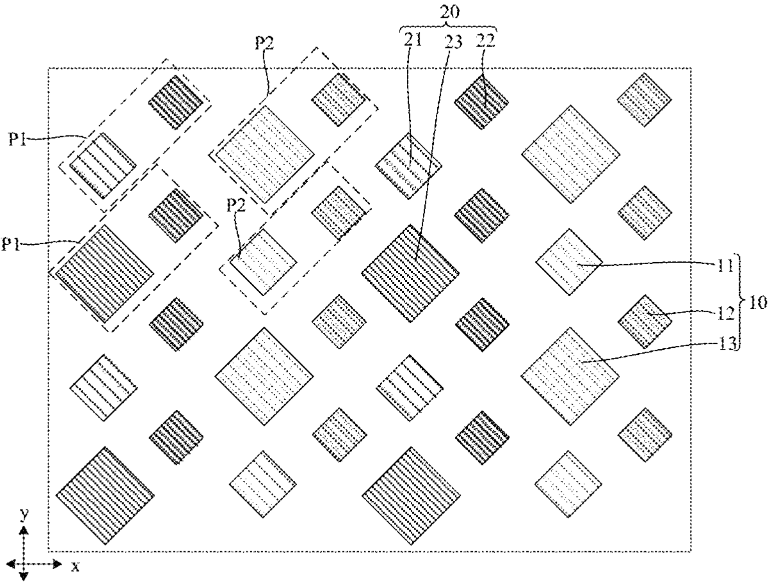
FIG. 15 is a schematic diagram of a display panel according to some embodiments of the present disclosure.

In some embodiments of the present disclosure, FIG. 15 is a schematic diagram of a display panel according to some embodiments of the present disclosure. As shown in FIG. 15, the first light-emitting device 10 includes the first-color first light-emitting device 11, the second-color first light-emitting device 12 and the third-color first light-emitting device 13. The second light-emitting device 20 includes the first-color second light-emitting device 21, the second-color second light-emitting device 22 and the third-color second light-emitting device 23. The display panel includes the first pixel area P1 and the second pixel area P2. The first pixel area P1 includes at least two first light-emitting devices 10 of different colors, and the second pixel area P2 includes at least two second light-emitting devices 20 of different colors. The first pixel area P1 and the second pixel area P2 are alternated along the second direction x, and the first pixel area P1 is arranged into pixel columns along the third direction y, or the plurality of second pixel areas P2 are arranged into pixel columns along the third direction y. The second direction x and the third direction y intersect each other.

Figure 16:
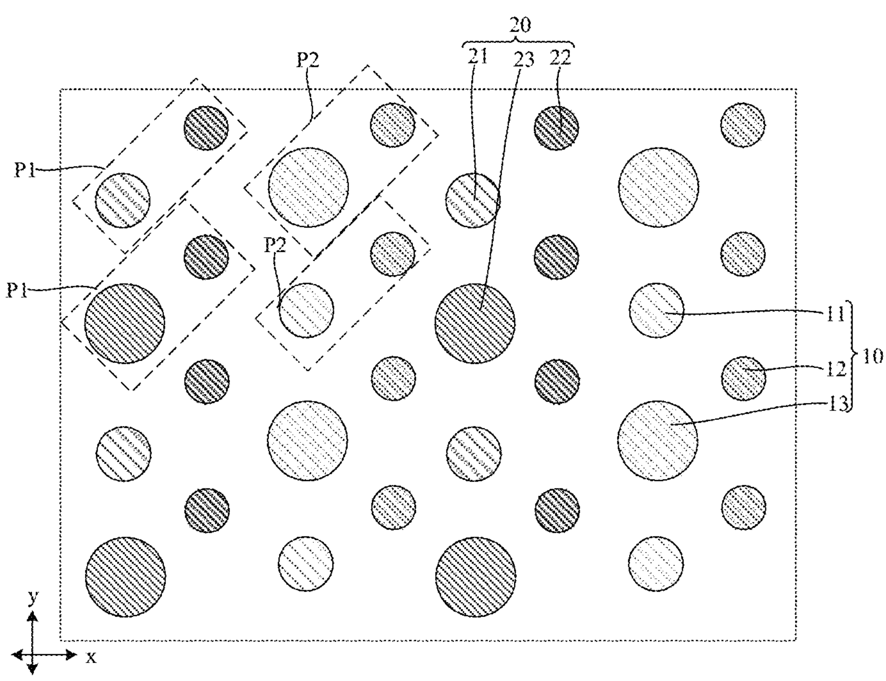
FIG. 16 is a schematic diagram of a display panel according to some embodiments of the present disclosure.

In some embodiments of the present disclosure, FIG. 16 is a schematic diagram of a display panel according to some embodiments of the present disclosure. As shown in FIG. 16, the first light-emitting device 10 includes the first-color first light-emitting device 11, the second-color first light-emitting device 12 and the third-color first light-emitting device 13. The second light-emitting device 20 includes the first-color second light-emitting device 21, the second-color second light-emitting device 22 and the third-color second light-emitting device 23. The display panel includes the first pixel area P1 and the second pixel area P2. The first pixel area P1 includes at least two first light-emitting devices 10 of different colors, and the second pixel area P2 includes at least two second light-emitting devices 20 of different colors. The first pixel area P1 and the second pixel area P2 are alternated along the second direction x, and the first pixel area P1 is arranged into pixel columns along the third direction y, or the plurality of second pixel areas P2 are arranged into pixel columns along the third direction y. In some embodiments of the present disclosure, the shape of each light-emitting device is circular.

In some embodiments of the present disclosure, as shown in FIG. 1, the display panel includes a plurality of pixel areas P, and one of the plurality of pixel areas P includes at least two sub-pixels sp of different colors. In some embodiments of the present disclosure, a sub-pixel sp includes at least one first light-emitting device 10 and at least one second light-emitting device 20 of the same color. FIG. 1 shows a pixel area P including three sub-pixels sp.

Figure 17:
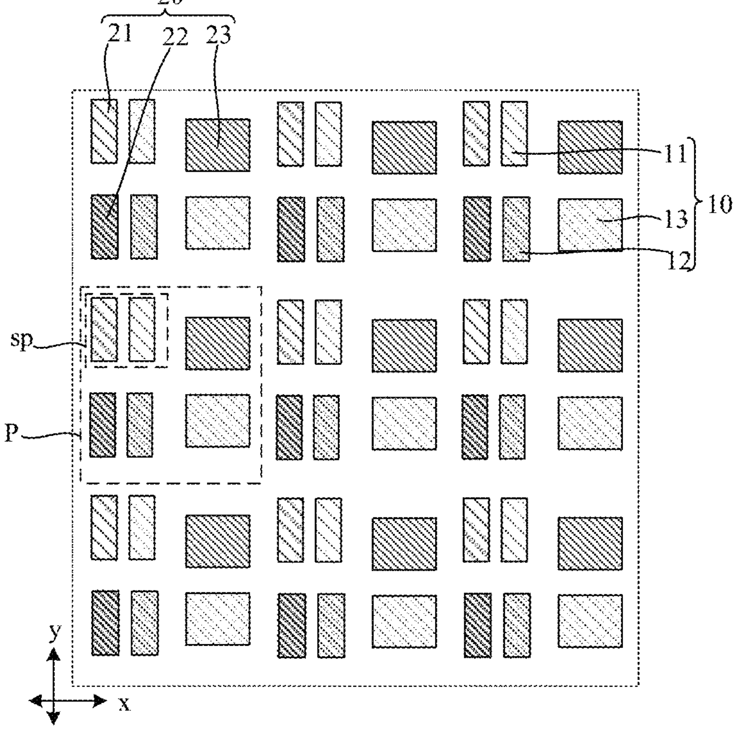
FIG. 17 is a schematic diagram of a display panel according to some embodiments of the present disclosure.

In some embodiments of the present disclosure, FIG. 17 is a schematic diagram of a display panel according to some embodiments of the present disclosure. As shown in FIG. 17, the first light-emitting device 10 includes the first-color first light-emitting device 11, the second-color first light-emitting device 12 and the third-color first light-emitting device 13. The second light-emitting device 20 includes the first-color second light-emitting device 21, the second-color second light-emitting device 22 and the third-color second light-emitting device 23. The display panel includes the plurality of pixel areas P, and one of the plurality of pixel areas P includes at least two sub-pixels sp of different colors. In some embodiments of the present disclosure, a sub-pixel sp includes at least one first light-emitting device 10 and at least one second light-emitting device 20 of the same color.

Figure 18:
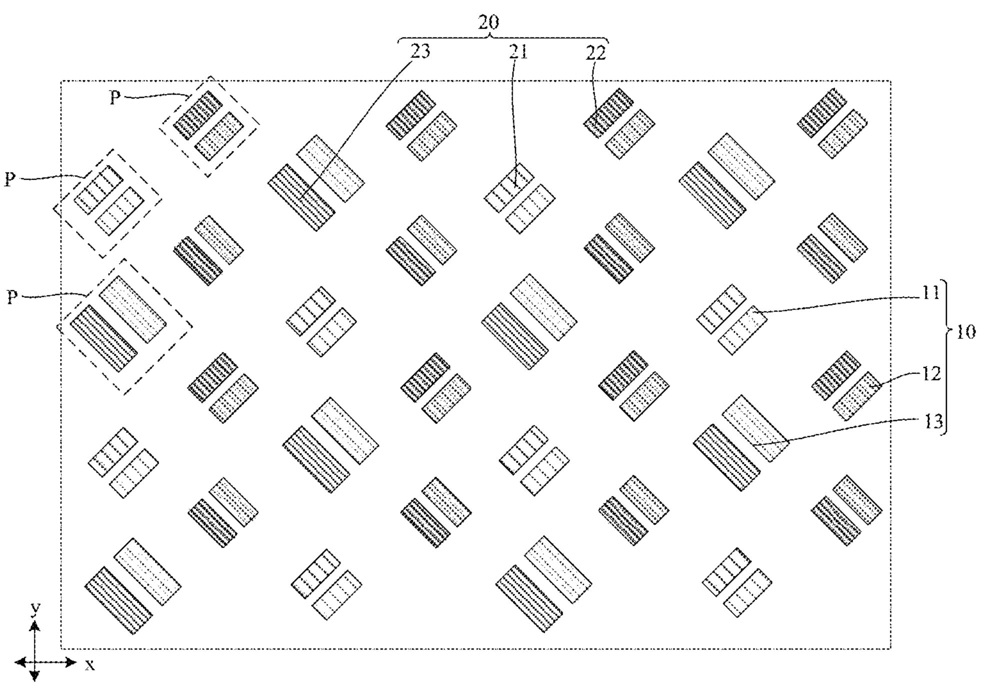
FIG. 18 is a schematic diagram of a display panel according to some embodiments of the present disclosure.

In some embodiments of the present disclosure, FIG. 18 is a schematic diagram of a display panel according to some embodiments of the present disclosure. As shown in FIG. 18, the first light-emitting device 10 includes the first-color first light-emitting device 11, the second-color first light-emitting device 12 and the third-color first light-emitting device 13. The second light-emitting device 20 includes the first-color second light-emitting device 21, the second-color second light-emitting device 22 and the third-color second light-emitting device 23. The display panel includes the plurality of pixel areas P, and one of the plurality of pixel areas P includes at least two sub-pixels sp of different colors. In some embodiments of the present disclosure, a sub-pixel sp includes at least one first light-emitting device 10 and at least one second light-emitting device 20 of the same color.

Figure 19:
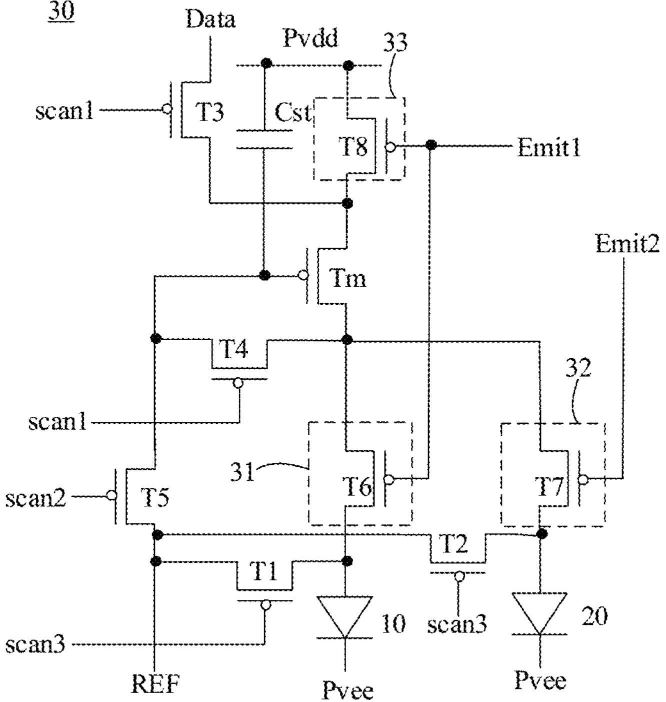
FIG. 19 is a schematic diagram of a pixel circuit according to some embodiments of the present disclosure.

In some embodiments of the present disclosure, the display panel further includes a pixel circuit, and the pixel circuit is located between the substrate 00 and the light-emitting devices 1. One pixel circuit is connected to one first light-emitting device 10 and one second light-emitting device 20. FIG. 19 is a schematic diagram of a pixel circuit according to some embodiments of the present disclosure. As shown in FIG. 19, the pixel circuit 30 includes a driving transistor Tm, a first light-emitting control module 31, a second light-emitting control module 32, a first electrode reset transistor T1 and a second electrode reset transistor T2. The first light-emitting control module 31 is connected between the driving transistor Tm and a first electrode of the first light-emitting device 10, and the second light-emitting control module 32 is connected between the driving transistor Tm and a first electrode of the second light-emitting device 20. The first electrode reset transistor T1 is connected to the first electrode of the first light-emitting device 10, and the second electrode reset transistor T2 is connected to the first electrode of the second light-emitting device 20. In some embodiments of the present disclosure, the first light-emitting device 10 and the second light-emitting device 20 are connected to the same driving transistor Tm, which is configured to generate a driving current, and an electrode reset transistor and a light-emitting control module are respectively provided for the two light-emitting devices. Assuming that only one electrode reset transistor is provided for the two light-emitting devices, the first electrodes of the two light-emitting devices are electrically connected to each other. Even if the two light-emitting devices are provided with light control modules, respectively, the light-emitting brightness will be disturbed because of the electrical connection of the first electrodes of the two light-emitting devices. However, the configuration according to the embodiments of the present disclosure can control the two light-emitting devices to reset and emit light independently, thereby achieving that the light emission of the two light-emitting devices does not interfere with each other. For example, in the anti-peeping mode, the first light-emitting device 10 can emit light while the second light-emitting device 20 does not emit light, thereby achieving the effect of the anti-peeping mode.

As shown in FIG. 19, the pixel circuit 30 further includes a third light-emitting control module 33, one end of the third light-emitting control module 33 is connected to a first power supply signal Pvdd, and the other end of the third light-emitting control module 33 is connected to the driving transistor Tm. The display panel further includes a first light-emitting control line Emit1 and a second light-emitting control line Emit2, a control end of the first light-emitting control module 31 and a control end of the third light-emitting control module 33 are connected to the first light-emitting control line Emit1, and a control end of the second light-emitting control module 32 is connected to the second light-emitting control line Emit2. In some embodiments of the present disclosure, the first light-emitting control module 31 and the third light-emitting control module 33 are controlled by the first light-emitting control line Emit1, and the second light-emitting control module 32 is controlled by the second light-emitting control line Emit2. The first light-emitting control line Emit1 controls the light-emitting state of the first light-emitting device 10, and the first light-emitting control line Emit1 and the second light-emitting control line Emit2 jointly control the light-emitting state of the second light-emitting device 20. For example, in the anti-peeping mode, the first light-emitting control line Emit1 is set to provide an enable signal, while the second light-emitting control line Emit2 does not provide an enable signal, so that the first light-emitting device 10 can emit light, while the second light-emitting device 20 does not emit light, thereby achieving the effect of the anti-peeping mode.

As shown in FIG. 19, the pixel circuit 30 further includes a data writing transistor T3, a threshold compensation transistor T4, a gate reset transistor T5, and a storage capacitor Cst. The first light-emitting control module 31 includes a first transistor T6, the second light-emitting control module 32 includes a second transistor T7, and the third light-emitting control module 33 includes a third transistor T8. The display panel includes a first scanning signal line scan1, a second scanning signal line scan2 and a third scanning signal line scan3, a control end of the data writing transistor T3 and a control end of the threshold compensation transistor T4 are connected to the first scanning signal line scan1, a control end of the gate reset transistor T5 is connected to the second scanning signal line scan2, a control end of the first electrode reset transistor T1 and a control end of the second electrode reset transistor T2 are connected to the third scanning signal line scan3. The data writing transistor T3 is further connected to a data line Data, and the gate reset transistor T5, the first electrode reset transistor T1 and the second electrode reset transistor T2 are connected to a reset signal line REF, respectively. A second electrode of the first light-emitting device 10 and a second electrode of the second light-emitting device 20 are connected to a second power supply signal Pvee.

In some embodiments of the present disclosure, a working cycle of the pixel circuit includes a reset phase, a writing phase and a light-emitting phase. The display panel includes the first display mode. In the first display mode: in the reset phase and the writing phase, the first light-emitting control line Emit1 provides a non-enable signal, and the second light-emitting control line Emit2 provides a non-enable signal; and in the light-emitting phase, the first light-emitting control line Emit1 provides an enable signal, and the second light-emitting control line Emit2 provides a non-enable signal. The first display mode is the anti-peeping mode. In the light-emitting phase of the first display mode, the first light-emitting control line Emit1 provides an enable signal to control the first light-emitting device 10 to emit light. In the first display mode, the second light-emitting control line Emit2 provides a non-enable signal during the working cycle of the pixel circuit, that is, the second light-emitting control line Emit2 provides a constant voltage signal, which can reduce power consumption of the display panel.

Figure 20:
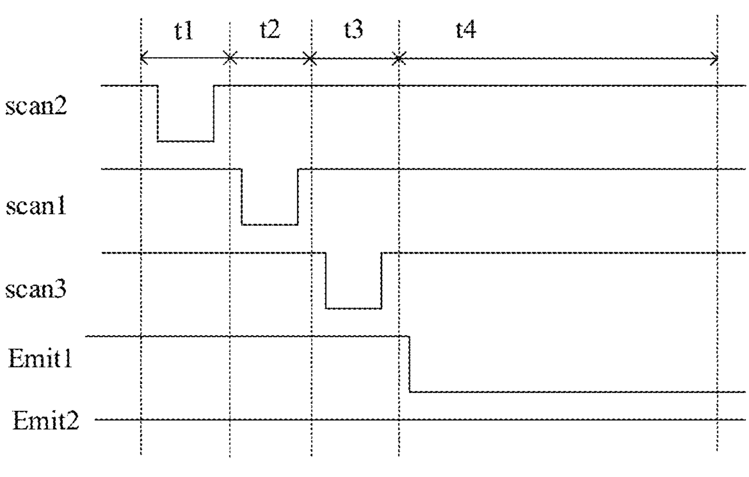
FIG. 20 is a timing diagram of signals according to some embodiments of the present disclosure.

In an embodiment of the present disclosure, FIG. 20 is a timing diagram of signals according to some embodiments of the present disclosure. FIG. 20 shows the signal timing of the pixel circuit in the first display mode. As shown in FIG. 20, the pixel circuit includes a first reset phase t1, a writing phase t2, a second reset phase t3 and a light-emitting phase t4. In the first reset phase t1, the second scan signal line scan2 provides an enable signal to control the gate reset transistor T5 to turn on and reset the gate of the driving transistor Tm. In the writing phase t2, the first scanning signal line scan1 provides an enable signal to control the data writing transistor T3 and the threshold compensation transistor T4 to turn on, write the data voltage to the gate of the driving transistor Tm, and compensate the threshold voltage of the driving transistor Tm. In the second reset phase t3, the third scan signal line scan3 provides an enable signal to control the first electrode reset transistor T1 and the second electrode reset transistor T2 to turn on, and reset the first light-emitting device 10 and the second light-emitting device 20, respectively. In the light-emitting phase t4, the first light-emitting control line Emit1 provides an enable signal, the second light-emitting control line Emit2 provides a non-enable signal, and the driving transistor Tm provides a driving current to the first light-emitting device 10 to control the first light-emitting device 10 to emit light.

The display panel according to some embodiments of the present disclosure includes the second display mode. In the second display mode: in the reset phase and the writing phase, the first light-emitting control line Emit1 provides a non-enable signal, and the second light-emitting control line Emit2 provides a non-enable signal; and in the light-emitting phase, the first light-emitting control line Emit1 provides an enable signal, and the second light-emitting control line Emit2 provides an enable signal. In some embodiments of the present disclosure, in the second display mode, the first light-emitting control line Emit1 and the second light-emitting control line Emit2 provide the same signal. The second display mode is the sharing mode. In this mode, both the first light-emitting device 10 and the second light-emitting device 20 emit light, which can meet the brightness requirements in the sharing mode and reduce the power consumption. In addition, in some embodiments of the present disclosure, the first light-guiding structure 031 allows the first light-emitting device 10 to emit more light in the front viewing direction, and the second light-guiding structure 032 can increase the lateral light output of the second light-emitting device 20, thereby balancing the brightness difference between the front viewing direction and the direction of a large viewing angle in the sharing mode and improving the overall display effect.

Figure 21:
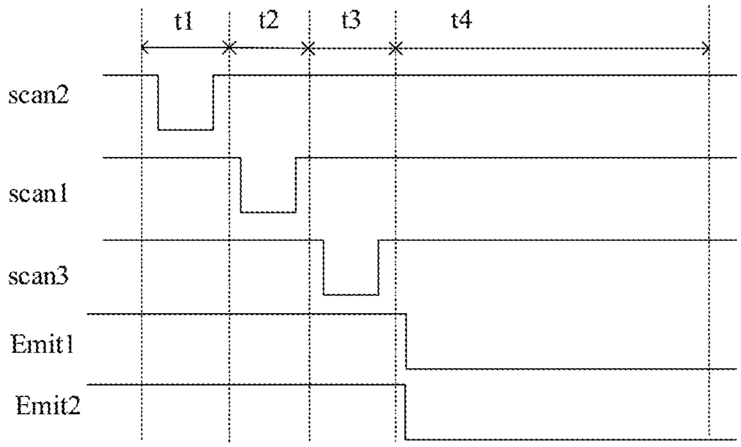
FIG. 21 is a timing diagram of signals according to some embodiments of the present disclosure.

In an embodiment of the present disclosure, FIG. 21 is a timing diagram of signals according to some embodiments of the present disclosure. FIG. 21 shows the signal timing of the pixel circuit in the first display mode. As shown in FIG. 21, the pixel circuit includes the first reset phase t1, the writing phase t2, the second reset phase t3 and the light-emitting phase t4. According to FIG. 21, it can be seen that in the reset phase (including the first reset phase t1 and the second reset phase t3) and the writing phase t2, the first light-emitting control line Emit1 provides a non-enable signal, and the second light-emitting control line Emit2 provides a non-enable signal; and in the light-emitting phase t4, the first light-emitting control line Emit1 provides an enable signal, and the second light-emitting control line Emit2 provides an enable signal. In this mode, the first light-emitting device 10 and the second light-emitting device 20 emit light simultaneously.

Figure 22:
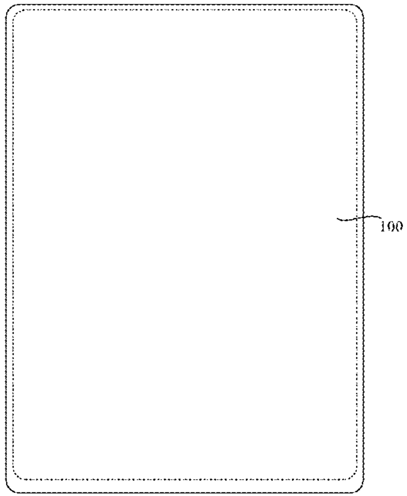
FIG. 22 is a schematic diagram of a display apparatus according to some embodiments of the present disclosure.

Based on the same inventive concept, an embodiment of the present disclosure provides a display apparatus. FIG. 22 is a schematic diagram of a display apparatus according to some embodiments of the present disclosure. As shown in FIG. 22, the display apparatus includes the display panel 100 according to any embodiment of the present disclosure. The structure of the display panel 100 has been described in the above embodiments, which will not be elaborated in the present disclosure. The display apparatus according to the embodiments of the present disclosure can be an electronic apparatus with display function such as a mobile phone, tablet, computer, television, and smart wearable product.

The above are merely exemplary embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various modifications, readjustments, and substitutions without departing from the scope of the present disclosure.

What is claimed is:

1. A display panel, comprising:

a substrate;

a display layer located on a side of the substrate, wherein the display layer comprises a pixel definition layer and light-emitting devices, the pixel definition layer comprises a first opening and a second opening, one of the light-emitting devices comprises a first light-emitting device and a second light-emitting device, the first light-emitting device is located in the first opening, and the second light-emitting device is located in the second opening;

a light-blocking structure located on a side of the display layer away from the substrate, wherein an orthographic projection of at least part of the light-blocking structure on the substrate is located between orthographic projections of two adjacent light-emitting devices on the substrate; along a first direction, a distance between the light-blocking structure and the first opening is smaller than a distance between the light-blocking structure and the second opening, and the first direction is parallel to a plane of the substrate; and light-guiding structures located on the side of the display layer away from the substrate, wherein along a direction perpendicular to the plane of the substrate, the first light-emitting device at least partially overlaps one of the light-guiding structures, and/or the second light-emitting device at least partially overlaps with one of the light-guiding structures, wherein the light-guiding structures comprise a first light-guiding structure; and along the direction perpendicular to the plane of the substrate, the first light-emitting device at least partially overlaps the first light-guiding structure;

the first light-guiding structure comprises a first refractive portion and a second refractive portion, a refractive index of the first refractive portion is different from a refractive index of the second refractive portion, and the first refractive portion is located on a side of the second refractive portion adjacent to the substrate; and the first refractive portion has a first hollow, and at least part of the second refractive portion is located in the first hollow; and along the direction perpendicular to the plane of the substrate, the first hollow at least partially overlaps the first light-emitting device.

2. The display panel according to claim 1, wherein along the first direction, a distance between the light-blocking structure and the first opening is d1, a distance between the light-blocking structure and the second opening is d2, where 2 μm≤d2−d1≤5 μm.

3. The display panel according to claim 1, wherein the light-blocking structure is located on a side of the light-guiding structures away from the light-emitting devices.

4. The display panel according to claim 1, wherein the light-guiding structures further comprise a second light-guiding structure;

in the direction perpendicular to the plane of the substrate, the second light-emitting device at least partially overlaps the second light-guiding structure;

the second light-guiding structure comprises a third refractive portion and a fourth refractive portion, a refractive index of the third refractive portion is different from a refractive index of the fourth refractive portion, and the third refractive portion is located on a side of the fourth refractive portion adjacent to the substrate; and wherein the first refractive portion and the third refractive portion are made of a same material, and the second refractive portion and the fourth refractive portion are made of a same material.

5. The display panel according to claim 1, wherein in a direction from a center of the first light-emitting device to an edge of the first light-emitting device, a thickness of the first refractive portion gradually increases; and the refractive index of the first refractive portion is smaller than the refractive index of the second refractive portion.

6. The display panel according to claim 5, wherein the first refractive portion has a first side surface and a first bottom surface; and in the direction from the center of the first light-emitting device to the edge of the first light-emitting device, a distance between the first side surface and the first bottom surface gradually increases; and an angle formed by the first side surface and the first bottom surface and facing the first refractive portion is θ1, where 30°≤θ1≤70°.

7. The display panel according to claim 1, wherein along the first direction, a width of the first opening is D11, and a width of the first hollow is D12;

the light-blocking structure has a third opening, and along the direction perpendicular to the plane of the substrate, the third opening at least partially overlaps the first light-emitting device; and along the first direction, a width of the third opening is D13;

where D13≥D12>D11 or D11>D12≥D13.

8. The display panel according to claim 1, wherein the light-guiding structures comprise a second light-guiding structure, and along the direction perpendicular to the plane of the substrate, the second light-emitting device at least partially overlaps the second light-guiding structure;

the second light-guiding structure comprises a third refractive portion and a fourth refractive portion, a refractive index of the third refractive portion is different from a refractive index of the fourth refractive portion, and the third refractive portion is located on a side of the fourth refractive portion adjacent to the substrate; and along the direction perpendicular to the plane of the substrate, the third refractive portion at least partially overlaps the second light-emitting device.

9. The display panel according to claim 8, wherein in a direction from a center of the second light-emitting device to an edge of the second light-emitting device, a thickness of the third refractive portion gradually decreases; and the refractive index of the third refractive portion is smaller than the refractive index of the fourth refractive portion.

10. The display panel according to claim 9, wherein the third refractive portion has a second side surface and a second bottom surface; and in the direction from the center of the second light-emitting device to the edge of the second light-emitting device, a distance between the second side surface and the second bottom surface gradually decreases; and an angle formed by the second side surface and the second bottom surface and facing the third refractive portion is θ2, where 30°≤θ2≤70°.

11. The display panel according to claim 8, wherein the first light-emitting device comprises a first-color first light-emitting device, the second light-emitting device includes a first-color second light-emitting device, and the first-color first light-emitting device and the first-color second light-emitting device have a same color; and a width of the first hollow, overlapping the first-color first light-emitting device along the direction perpendicular to the plane of the substrate, in the first direction is D15, and a width of the third refractive portion, overlapping the first-color second light-emitting device along the direction perpendicular to the plane of the substrate, in the first direction is D25; where D25>D15.

12. The display panel according to claim 1, wherein along the direction perpendicular to the plane of the substrate, the first refractive portion at least partially overlaps the first light-emitting device.

13. The display panel according to claim 12, wherein in a direction from a center of the first light-emitting device to an edge of the first light-emitting device, a thickness of the first refractive portion gradually decreases; and the refractive index of the first refractive portion is greater than the refractive index of the second refractive portion.

14. The display panel according to claim 13, wherein the first refractive portion has a third side surface and a third bottom surface; and in the direction from the center of the first light-emitting device to the edge of the first light-emitting device, a distance between the third side surface and the third bottom surface gradually decreases; and an angle formed by the third side surface and the third bottom surface and facing the third refractive portion is θ3, where 30°≤θ3<70°.

15. The display panel according to claim 12, wherein along the first direction, a width of the first opening is D11, and a width of the first refractive portion is D14;

the light-blocking structure has a third opening;

along the direction perpendicular to the plane of the substrate, the third opening at least partially overlaps the first light-emitting device; and along the first direction, a width of the third opening is D13;

where D13≥D14>D11, or D11>D14≥D13.

16. The display panel according to claim 12, wherein the light-guiding structures comprises a second light-guiding structure, and along the direction perpendicular to the plane of the substrate, the second light-emitting device at least partially overlaps the second light-guiding structure;

the second light-guiding structure comprises a third refractive portion and a fourth refractive portion, a refractive index of the third refractive portion is different from a refractive index of the fourth refractive portion, and the third refractive portion is located on a side of the fourth refractive portion adjacent to the substrate; and the third refractive portion has a second hollow, and at least part of the fourth refractive portion is located in the second hollow; and along the direction perpendicular to the plane of the substrate, the second hollow at least partially overlaps the second light-emitting device.

17. The display panel according to claim 16, wherein in a direction from a center of the second light-emitting device to an edge of the second light-emitting device, a thickness of the third refractive portion gradually increases; and the refractive index of the third refractive portion is greater than the refractive index of the fourth refractive portion.

18. The display panel according to claim 17, wherein the third refractive portion has a fourth side surface and a fourth bottom surface; and in the direction from the center of the second light-emitting device to the edge of the second light-emitting device, a distance between the fourth side surface and the fourth bottom surface gradually increases; and an angle formed by the fourth side surface and the fourth bottom surface and facing the third refractive portion is θ4, where 30°≤θ4≤70°.

19. The display panel according to claim 16, wherein the first light-emitting device comprises a first-color first light-emitting device, the second light-emitting device comprises a first-color second light-emitting device, and the first-color first light-emitting device and the first-color second light-emitting device have a same color; and a width of the first refractive portion, overlapping the first-color first light-emitting device along the direction perpendicular to the plane of the substrate, in the first direction is D16, and a width of the second hollow, overlapping the first-color second light-emitting device along the direction perpendicular to the plane of the substrate, in the first direction is D26; where D26>D16.

20. The display panel according to claim 1, wherein the light-guiding structures comprise a second light-guiding structure; along the direction perpendicular to the plane of the substrate, the second light-emitting device at least partially overlaps the second light-guiding structure; and the second light-guiding structure comprises a third refractive portion and a fourth refractive portion, and a refractive index of the third refractive portion is different from a refractive index of the fourth refractive portion; and along the direction perpendicular to the plane of the substrate, the third refractive portion at least partially overlaps the second light-emitting device; or the third refractive portion has a second hollow, and along the direction perpendicular to the plane of the substrate, the second hollow at least partially overlaps the second light-emitting device.

21. The display panel according to claim 20, wherein in a direction from a center of the second light-emitting device to an edge of the second light-emitting device, a thickness of the third refractive portion gradually decreases; and the refractive index of the third refractive portion is smaller than the refractive index of the fourth refractive portion; or in the direction from the center of the second light-emitting device to the edge of the second light-emitting device, the thickness of the third refractive portion gradually increases; and the refractive index of the third refractive portion is greater than the refractive index of the fourth refractive portion.

22. The display panel according to claim 20, wherein along the first direction, a width of the second opening is D21; the light-blocking structure has a fourth opening, and along the direction perpendicular to the plane of the substrate, the fourth opening at least partially overlaps the second light-emitting device; and along the first direction, a width of the fourth opening is D23; and along the first direction, a width of the third refractive portion is D22, where D23>D22>D21; or, along the first direction, a width of the second hollow is D22, where D23>D21>D22.

23. The display panel according to claim 1, wherein the first light-emitting device comprises a first-color first light-emitting device, the second light-emitting device comprises a first-color second light-emitting device, and the first-color first light-emitting device and the first-color second light-emitting device have a same color; and an area of the first opening corresponding to the first-color first light-emitting device is smaller than an area of the second opening corresponding to the first-color second light-emitting device.

24. The display panel according to claim 1, wherein the light-blocking structure has a third opening and a fourth opening; and along the direction perpendicular to the plane of the substrate, the third opening at least partially overlaps the first light-emitting device, and the fourth opening at least partially overlaps the second light-emitting device;

the first light-emitting device comprises a first-color first light-emitting device, the second light-emitting device comprises a first-color second light-emitting device, and the first-color first light-emitting device and the first-color second light-emitting device have a same color; and wherein an area of the third opening overlapping the first-color first light-emitting device is smaller than an area of the fourth opening overlapping the first-color second light-emitting device.

25. The display panel according to claim 1, wherein the display panel has a first display mode and a second display mode;

in the first display mode, the first light-emitting device emits light, and the second light-emitting device does not emit light; and in the second display mode, the first light-emitting device emits light, and the second light-emitting device emits light.

26. The display panel according to claim 1, further comprising pixel circuits located between the substrate and the light-emitting devices, wherein one of the pixel circuits is connected to one first light-emitting device and one second light-emitting device;

one of the pixel circuits comprises a driving transistor, a first light-emitting control module, a second light-emitting control module, a first electrode reset transistor and a second electrode reset transistor;

the first light-emitting control module is connected between the driving transistor and a first electrode of the first light-emitting device, and the second light-emitting control module is connected between the driving transistor and a first electrode of the second light-emitting device; and the first electrode reset transistor is connected to the first electrode of the first light-emitting device, and the second electrode reset transistor is connected to the first electrode of the second light-emitting device.

27. The display panel according to claim 26, wherein one of the pixel circuits further comprises a third light-emitting control module, one end of the third light-emitting control module is connected to a first power supply signal, and another end of the third light-emitting control module is connected to the driving transistor;

the display panel further comprises a first light-emitting control line and a second light-emitting control line; and a control end of the first light-emitting control module and a control end of the third light-emitting control module are connected to the first light-emitting control line, and a control end of the second light-emitting control module is connected to the second light-emitting control line.

28. The display panel according to claim 27, wherein a working cycle of the pixel circuit comprises a reset phase, a writing phase and a light-emitting phase;

the display panel has a first display mode; and in the first display mode, in the reset phase and the writing phase, the first light-emitting control line provides a non-enable signal, and the second light-emitting control line provides a non-enable signal; and in the light-emitting phase, the first light-emitting control line provides an enable signal, and the second light-emitting control line provides a non-enable signal.

29. The display panel according to claim 27, wherein a working cycle of the pixel circuit comprises a reset phase, a writing phase and a light-emitting phase;

the display panel has a second display mode; and in the second display mode, in the reset phase and the writing phase, the first light-emitting control line provides a non-enable signal, and the second light-emitting control line provides a non-enable signal; and in the light-emitting phase, the first light-emitting control line provides an enable signal and the second light-emitting control line provides an enable signal.

30. The display panel according to claim 1, further comprising a first pixel area and a second pixel area, wherein the first pixel area comprises at least two first light-emitting devices of different colors, and the second pixel area comprises at least two second light-emitting devices of different colors; and the first pixel area and the second pixel area are alternated along a second direction, and/or the first pixel area and the second pixel area are alternated along a third direction; and the second direction and the third direction intersect each other.

31. The display panel according to claim 1, comprising pixel areas, wherein one of pixel areas comprises at least two sub-pixels of different colors, and wherein the sub-pixel comprises at least one of the first light-emitting devices and at least one of the second light-emitting devices that have a same color.

32. A display apparatus, comprising a display panel, wherein the display panel comprises:

a substrate;

a display layer located on a side of the substrate, wherein the display layer comprises a pixel definition layer and light-emitting devices, the pixel definition layer comprises a first opening and a second opening, one of the light-emitting devices comprise a first light-emitting device and a second light-emitting device, the first light-emitting device is located in the first opening, and the second light-emitting device is located in the second opening;

a light-blocking structure located on a side of the display layer away from the substrate, wherein an orthographic projection of at least part of the light-blocking structure on the substrate is located between orthographic projections of two adjacent light-emitting devices on the substrate; along a first direction, a distance between the light-blocking structure and the first opening is smaller than a distance between the light-blocking structure and the second opening, and the first direction is parallel to a plane of the substrate; and light-guiding structures located on a side of the display layer away from the substrate, wherein along a direction perpendicular to the plane of the substrate, the first light-emitting device at least partially overlaps one of the light-guiding structures, and/or the second light-emitting device at least partially overlaps one of the light-guiding structures, wherein the light-guiding structures comprise a first light-guiding structure; and along the direction perpendicular to the plane of the substrate, the first light-emitting device at least partially overlaps the first light-guiding structure;

the first light-guiding structure comprises a first refractive portion and a second refractive portion, a refractive index of the first refractive portion is different from a refractive index of the second refractive portion, and the first refractive portion is located on a side of the second refractive portion adjacent to the substrate; and the first refractive portion has a first hollow, and at least part of the second refractive portion is located in the first hollow; and along the direction perpendicular to the plane of the substrate, the first hollow at least partially overlaps the first light-emitting device.

* * * * *